US006767796B2

(12) United States Patent
Tanaka et al.

(10) Patent No.: US 6,767,796 B2
(45) Date of Patent: Jul. 27, 2004

(54) METHOD OF MANUFACTURING SEMICONDUCTOR DEVICE AND THE SEMICONDUCTOR DEVICE

(75) Inventors: Masayuki Tanaka, Yokohama (JP); Kazuaki Nakajima, Kamakura (JP); Yoshitaka Tsunashima, Yokohama (JP); Takayuki Ito, Kawasaki (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/973,744

(22) Filed: Oct. 11, 2001

(65) Prior Publication Data

US 2002/0086486 A1 Jul. 4, 2002

(30) Foreign Application Priority Data

Oct. 12, 2000 (JP) .................................. P2000-312015

(51) Int. Cl.[7] .............................................. H01L 21/28
(52) U.S. Cl. ...................... 438/299; 438/664; 438/627; 438/643; 438/653
(58) Field of Search .............................. 438/233, 299, 438/530, 664, 683, 795, FOR 196, FOR 360, 627, 643, 653

(56) References Cited

U.S. PATENT DOCUMENTS 4,698,486 A * 10/1987 Sheets 5,545,925 A * 8/1996 Hanaoka
6,465,290 B1 * 10/2002 Suguro et al.
2003/0013280 A1 * 1/2003 Yamanaka

FOREIGN PATENT DOCUMENTS

JP 20001-93853 4/2001

OTHER PUBLICATIONS

Derwent Abstract: Derwent Acc No 1997–010536, 1999.*

* cited by examiner

*Primary Examiner*—George Pourson
(74) *Attorney, Agent, or Firm*—Finnegan, Henderson, Farabow, Garrett & Dunner, L.L.P.

(57) ABSTRACT

An aspect of the present invention provides a method of manufacturing a semiconductor device, including, forming an insulating film on a silicide layer formed at the surface of a silicon semiconductor substrate, etching the insulating film to form a contact hole in which the silicide layer is exposed, forming a metal nitride film on the bottom and side wall of the contact hole, carrying out a first heating process at 600° C. or lower on the substrate, carrying out, during the first heating process, a second heating process for 10 msec or shorter with light whose main wavelength is shorter than a light absorbing end of silicon, forming a contact conductor in the contact hole after the second heating process, and forming, on the insulating film, wiring that is electrically connected to the substrate through the contact conductor.

11 Claims, 20 Drawing Sheets

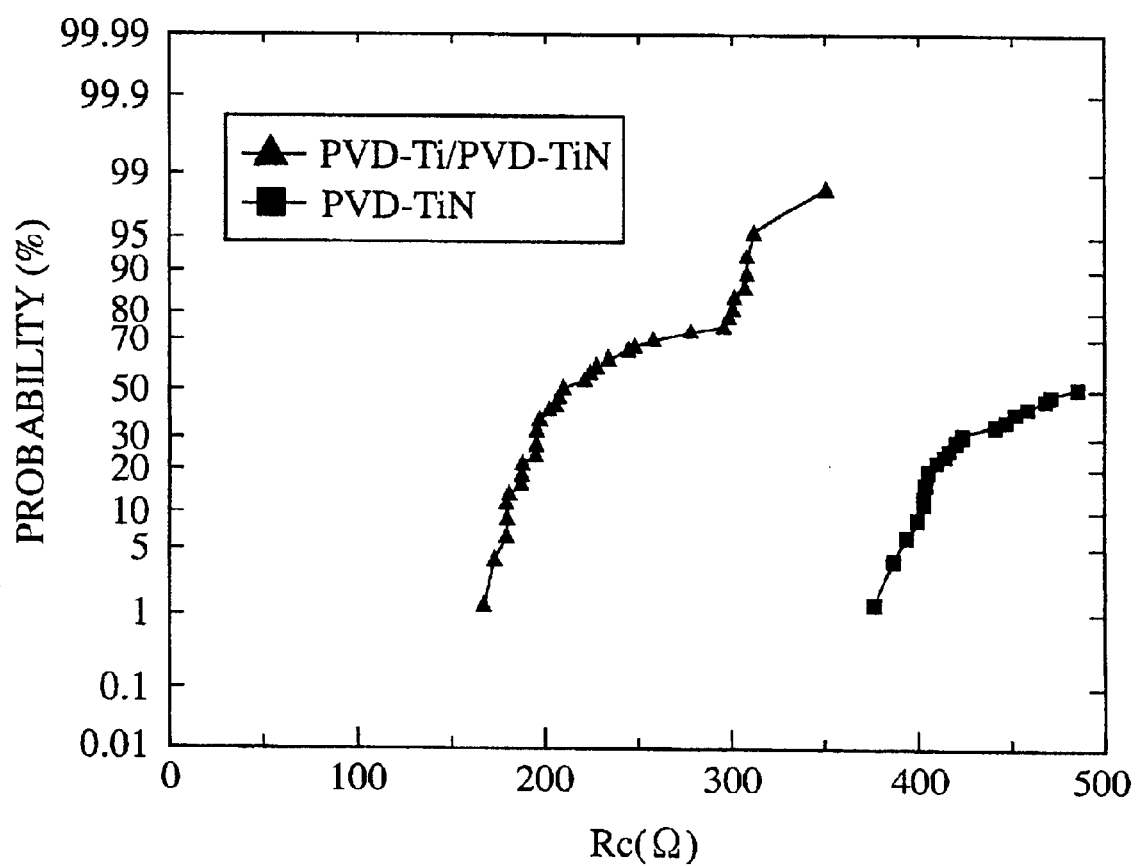

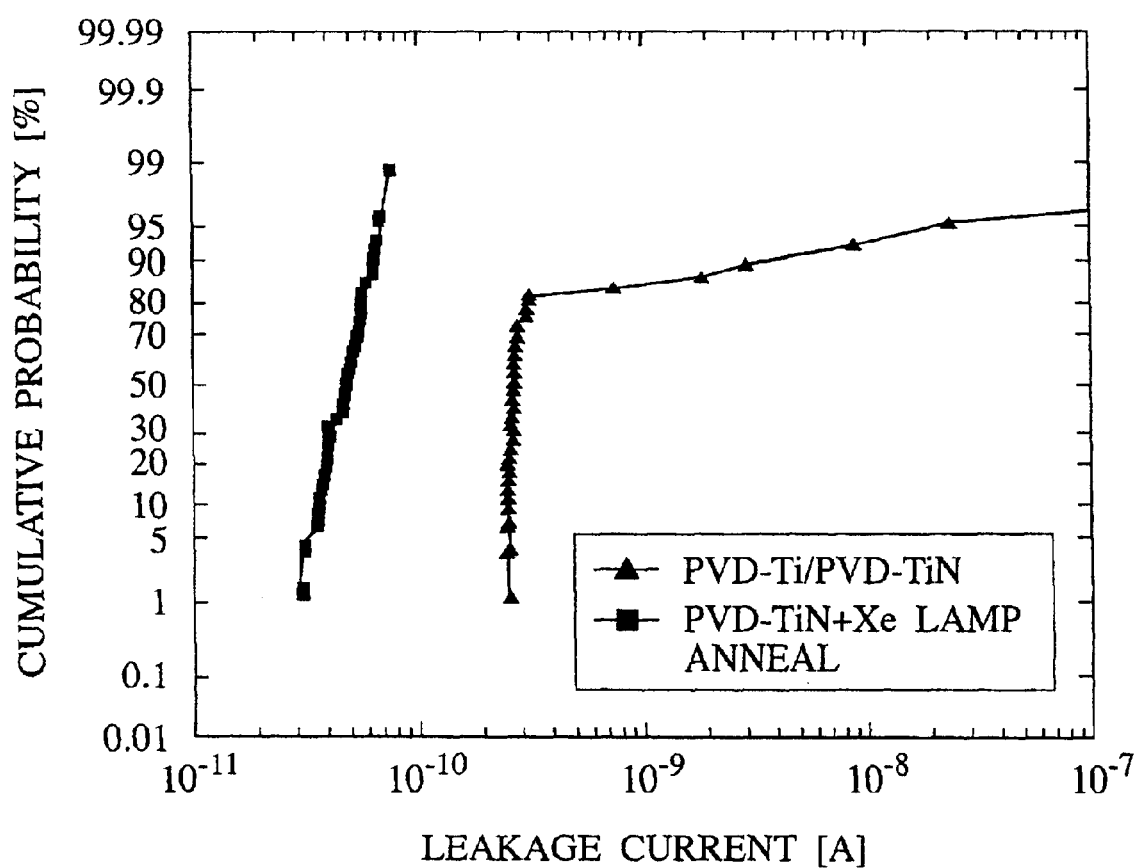

METHOD OF MANUFACTURING SEMICONDUCTOR DEVICE AND THE SEMICONDUCTOR DEVICE

CROSS REFERENCE TO RELATED APPLICATIONS

This application claims benefit of priority under 35 USC 119 based on Japanese Patent Application No. P2000-312015 filed on Oct. 12, 2000, the entire contents of which are incorporated by reference herein.

BACKGROUND OF THE INVENTION

1. Field of the Invention

The present invention relates to a method of manufacturing a semiconductor device, in particular, to a method of reforming contacts that connect a semiconductor substrate to wiring in a semiconductor device and refining films such as silicide films and silicon nitride films formed on the semiconductor substrate. The present invention also relates to the semiconductor device itself manufactured or reformed by the method.

2. Description of the Related Art

Large-scale integrated circuits (LSIs) including many elements such as transistors, resistors, and capacitors are widely installed for computers and communication devices. The performance of the device is dependent on the performance of the installed LSI, and the performance of the LSI is dependent on the degree of integration of elements in the LSI. The degree of integration of the LSI improves if the size of element of the LSI is reduced, and the element size reduces if the influence of heat treatment during manufacturing is minimized. The heat treatment causes unexpected damage on semiconductor elements and deteriorates the properties thereof. Various heat treatments are carried out during semiconductor device manufacturing, to improve connecting between contacts formed in an insulating film and a silicide layer formed on a semiconductor substrate, to form a silicide layer on gate electrodes and source/drain regions, to refine a silicon nitride film formed on DRAM gate electrodes, or to reform a metal silicide layer serving as EEPROM gate electrodes.

To property connect the bottom of a contact formed in an interlayer insulating film to a semiconductor substrate, a titanium (Ti) film is formed on the inner surface of a contact hole by spattering and a heat treatment is carried out to reduce a natural oxide film formed on the substrate and form a silicide layer in a source/drain region of the substrate below the Ti film. The spattering used to form the Ti film is an improper technique to completely fill very fine contact with high aspect rate, e.g., 0.1 -$\mu$m-generation with a tungsten film serving as a contact conductor. On the other hand, the Ti film is unable to form by thermal CVD (chemical vapor deposition), although there is a thermal CVD technique to properly form a TiN film in such fine contact holes. The TiN film, however, is not allowed to directly coat contact holes because conventional heat treatment for the TiN film is unable to reduce a natural oxide film formed on a substrate. According to the 0.1-$\mu$m-generation contact holes, the silicide layer formed in the source/drain region below the Ti film is too close to a junction between the source/drain region and the substrate, because the source/drain region of the 0.1-$\mu$m-generation is very shallow. This results in increasing a junction leakage current. The silicide layer formed below the contact wire will be unnecessary if the natural oxide film formed between the contact and silicide layer can be reduced (deoxidized) without using the Ti film. This is because the surface of the source/drain region is usually provided with a metal silicide layer such as a cobalt silicide layer that secures low resistance between the contact and the source/drain region if there is no interfering natural oxide film. However, reducing the natural oxide film without using the Ti film is nearly impossible to achieve because triggering a reaction between the TiN film and the substrate to reduce the natural oxide film needs a high-temperature heating process that surely deteriorates the impurity profile of the source/drain region.

Recent MOS transistors employ a metal silicide layer to reduce parasitic resistance. The metal silicide layer is formed on a diffusion layer through first and second heating processes. The first heating process makes a metal film react with a silicon semiconductor substrate and forms a metal monosilicide layer. After removing unreacted part of the metal film, the second heating process changes the metal monosilicide into metal disilicide. If the metal is cobalt (Co), the second heating process causes a small amount of Co atoms to diffuse into the substrate. The Co atoms form a deep level in Si and approach a junction between the diffusion layer and the substrate under the metal disilicide ($CoSi_2$) layer. These Co atoms around the junction increase a junction leakage current. It is necessary, therefore, to keep the $CoSi_2$ layer away from the junction by a distance of 100 to 150 nanometers (nm). As the size of each transistor because smaller, the diffusion layer becomes shallower to make it difficult to keep a proper distance between the metal disilicide layer and the junction.

To manufacture LSIs, it is imperative to form a silicon nitride (SiN) film that effectively functions as an etching stopper, a barrier, or an insulator. The SiN film made by chemical reaction between silicon source and ammonia contains hydrogen, and that made by chemical reaction between dichlorosilane or hexachlorosilane and ammonia contains hydrogen.

The SiN film containing hydrogen must be dehydrogenated through a high-temperature post-heat treatment. If the SiN film is formed on PMOS elements containing boron, the hydrogen removed from the SiN film causes the boron in the PMOS elements to rapidly diffuse. The post-heat treatment carried out on the SiN film may be activation annealing that is carried out at 900° C. or higher with a rapid thermal annealing apparatus. This annealing diffuses boron contained in the PMOS elements into a semiconductor substrate through a gate insulating film. The boron diffused to the substrate greatly changes the impurity profile of the substrate, thereby changing the threshold voltage of each PMOS transistor. The punch-through of the gate insulating film by boron atoms unevenly occurs over the substrate, and therefore, the threshold voltages of PMOS transistors vary over the substrate. At the same time, the gate electrode of each transistor is depleted. In this way, the high-temperature post-heat treatment on the SiN film on PMOS elements containing boron causes the punch-through of a gate insulating film by boron atoms, to drastically deteriorate the properties of the elements. Namely, the punch-through by boron atoms causes the problems of (1) changing the impurity profile of a semiconductor substrate to change the threshold voltages of transistors, (2) varying the transistor threshold voltages over the substrate, and (3) depleting the electrodes of the transistors.

The punch-through problem by boron atoms will be severer in the next-generation semiconductor elements that are more integrated with thinner gate insulating films and finer semiconductor elements. The quantity of boron atoms passing through a gate insulating film increases as the film becomes thinner and as the quantity of boron atoms used to decrease electrode resistance becomes larger. To improve the performance of a transistor, a diffusion layer where the transistor is formed must be shallow. The shallow diffusion layer is vulnerable to the boron atoms passed through a gate insulating film. In this way, using the hydrogen-containing SiN film for the next-generation semiconductor elements severely deteriorates the properties of semiconductor elements. To solve these problems, it is required to provide a technique of employing a hydrogen-reduced SiN film or a technique of carrying out dehydrogenation on a SiN film without deteriorating the properties of semiconductor elements.

A flash memory has control gate electrodes each consisting of a multilayered structure of polysilicon and tungsten silicide (WSi) films. The WSi film has high resistance, and therefore, must be processed through high-temperature post-heat treatment to reduce the resistance. This post-heat treatment must be carried out at 1000° C. or higher. This high temperature deteriorates the properties of gate oxide and nitride films. It is required, therefore, to provide a technique of reducing the resistance of a WSi film without deteriorating the properties of semiconductor elements.

SUMMARY OF THE INVENTION

A method of manufacturing a semiconductor device according to an embodiment of the present invention including, forming an insulating film on a silicide layer formed at the surface of a silicon semiconductor substrate, etching the insulating film to form a contact hole in which the silicide layer is exposed, forming a metal nitride film on the bottom and side wall of the contact hole, carrying out a first heating process at 600° C. or lower on the substrate, carrying out, during the first heating process, a second heating process for 10 msec or shorter with light whose main wavelength is shorter than a light absorbing end of silicon, forming a contact conductor in the contact hole after the second heating process, and forming, on the insulating film, wiring that is electrically connected to the substrate through the contact conductor.

A semiconductor device according to an embodiment of the present invention including, a semiconductor substrate, source/drain regions formed at the surface of the substrate, a polysilicon electrode formed on a gate insulating film that is formed on the substrate between the source/drain regions, and a metal silicide layer formed on the gate electrode and source/drain regions, a distance between the bottom of the metal silicide layer on the source/drain regions and a junction between the bottom of the source/drain regions and the substrate is shorter than 100 nm.

BRIEF DESCRIPTION OF THE DRAWINGS

FIG. 3 is a graph showing the contact resistance of sample semiconductor devices;

FIG. 8 is a graph showing the junction leakage current of the sample semiconductor devices;

DETAILED DESCRIPTION OF THE INVENTION

Figure 1A:
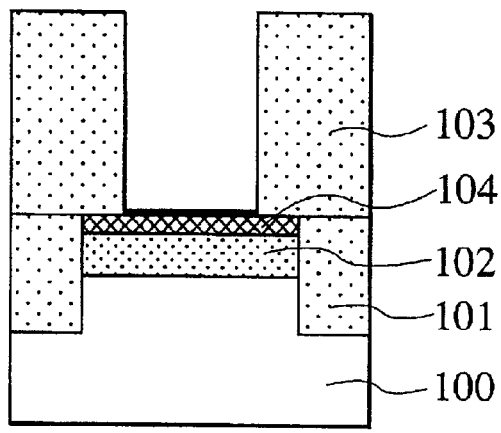
FIGS. 1A, 1B, and 1C are sectional views showing a semiconductor device in different manufacturing steps.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

A heat treatment apparatus used by this embodiment will be explained with reference to FIG. 25, which is a sectional view and roughly shows the apparatus. The apparatus has a chamber 601 made of aluminum. The chamber 601 has a table 602 on which a sample such as a silicon wafer is placed, an inlet 603 to introduce gases, an outlet 604 to discharge gases, a quartz glass 605 to introduce light, a first lamp 606 consisting of tubular lamps to pre-heat the sample, and a second lamp 607 consisting of flash lamps such as xenon (Xe) lamps. The first lamp 606 consists of, for example, 16 tungsten halogen lamps of 3 kW laid under a sample 608, to heat the sample 608 from the bottom thereof. The first lamp 606 is connected to a power source 610, and the second lamp 607 is connected to a power source 609. The activation timing, intervals, and times of the lamps 606 and 607 are controlled by a microcomputer (not shown). The lamps 606 and 607 are not necessarily tubular lamps. Each of them may consist of single-end lamps each having two external terminals on one side thereof.

Figure 25:
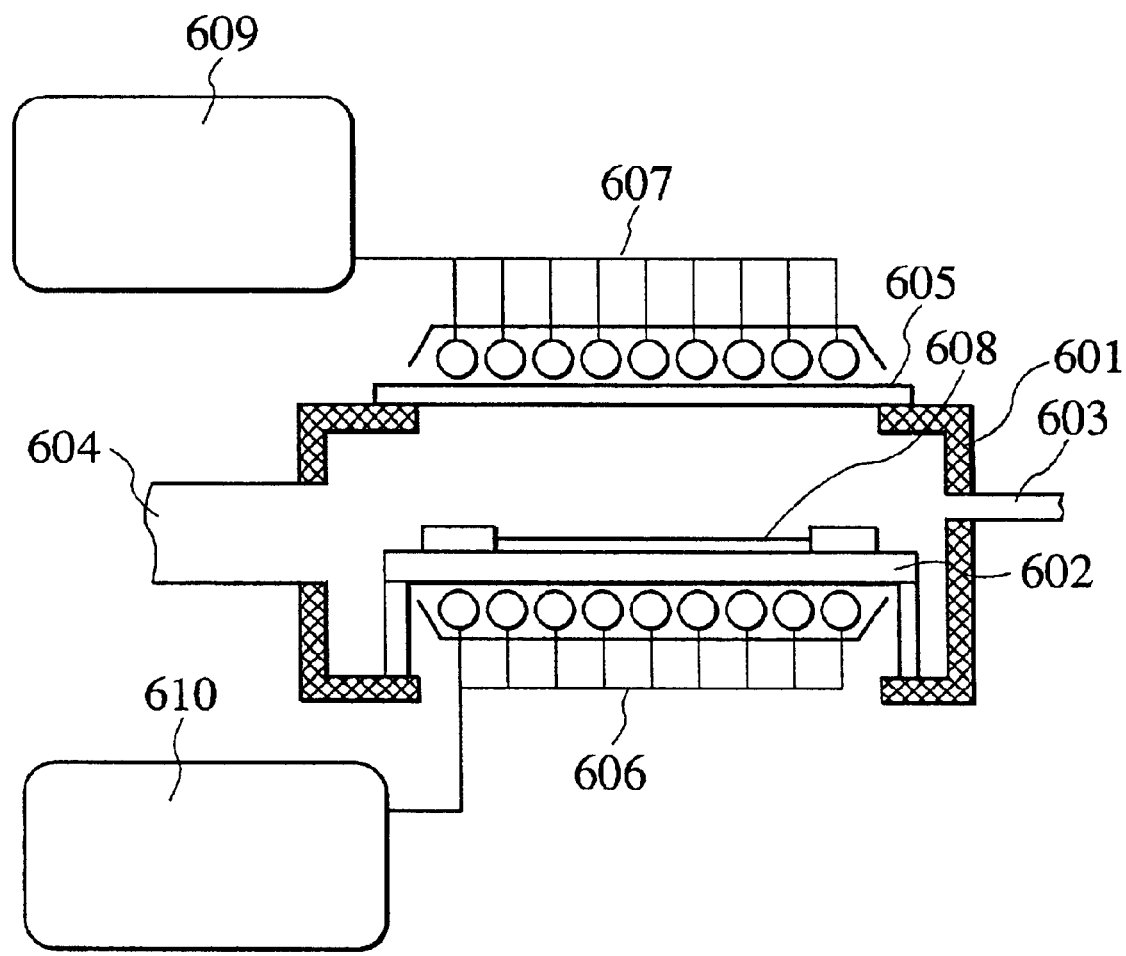
FIG. 25 is a sectional view showing a heat treatment apparatus used to achieve a semiconductor device manufacturing method according to an embodiment of the present invention.

With the apparatus of FIG. 25, the method according to this embodiment irradiates a semiconductor substrate with a large amount of photons within a short period, to reform contacts formed between the substrate and wiring, as well as films such as silicide and silicon nitride films formed on the substrate. More precisely, the method according to this embodiment carries out first and second heating processes. The first heating process is carried out on the semiconductor substrate, and the second heating process is carried out during the first heating process, to apply a large amount of photons to the substrate within a short period. The second heating process is completed within a very short period, and therefore, never affects the substrate and the films formed on the substrate.

According to an embodiment of the present invention, fine contact holes are formed in an insulating film formed on a semiconductor substrate. A metal nitride film such as a TiN film is formed in the contact holes. A first heating process is carried out at 600° C. or lower. During the first heating process, a second heating process is carried out within 10 millisecond (msec) or shorter. The second heating process emits light whose wavelength is shorter than a light absorbing end of silicon, to trigger a reaction between the TiN film and the substrate to reduce a natural oxide film formed between the TiN film and the substrate. The second heating process is completed within a very short period, and therefore, never affects the impurity profile of a diffusion layer formed in the substrate.

According to another embodiment of the present invention, a metal silicide film is formed on a diffusion layer and a gate electrode. More precisely, a first heating process is carried out to form a metal monosilicide layer on the diffusion layer. A second heating process is carried out at 600 degrees centigrade (° C.) or lower. During the second heating process, a third heating process is carried out for 10 msec or shorter. The third heating process emits light whose wavelength is shorter than a light absorbing end of silicon, to change the metal monosilicide layer made of, for example, CoSi into a metal disilicide layer made of $CoSi_2$ that is thermally stable. The third heating process diffuses no metal atoms such as Co atoms from the metal monosilicide layer into the semiconductor substrate.

The light emitted for a short period in the heating process may have a main wavelength for which metal (such as Ti) contained in a metal nitride (such as TiN) film shows a reflection coefficient of 0.50 or lower.

According to still another embodiment of the present invention, a heating process is carried out on a silicon nitride film formed on a polysilicon gate electrode. This heating process includes a first heating process to heat a semiconductor substrate to 300 to 650° C. and a second heating process carried out during the first heating process. The second heating process emits white light of 200 nm or longer in wavelength for 10 msec, preferably, 3 msec at 10 to 100 $J/cm^2$ at least one time. The second heating process promotes dehydrogenation, to prevent the punch-through of an insulating film by, for example, boron atoms.

According to still another embodiment of the present invention, a heating process is carried out on a tungsten silicide layer formed on a polysilicon gate electrode. This heating process includes a first heating process to heat a semiconductor substrate to 300 to 650° C. and a second heating process carried out during the first heating process. The second heating process emits white light of 200 nm or longer in wavelength for 10 msec, preferable, 3 msec at 10 to 100 $J/cm^2$ at least one time. The second heating process never deteriorates a gate insulating film under the polysilicon gate electrode.

Now, the embodiments of the present invention will be explained in detail with reference to accompanying drawings. The embodiments will be explained in comparison with related arts if necessary.

Figure 1B:
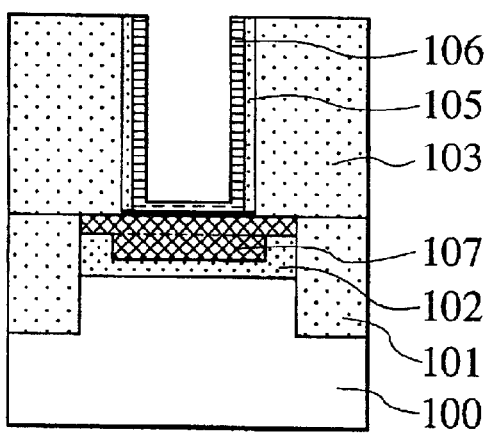
Figure 1C:
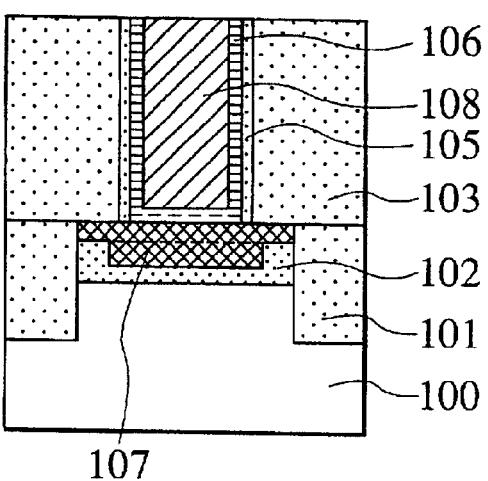

FIGS. 1A to 1C are sectional views showing manufacturing steps of a standard semiconductor device. In FIG. 1A, the semiconductor device has a semiconductor substrate 100 made of, for example, a silicon monocrystal. The substrate 100 has STI (shallow trench isolation) regions 101. Between the STI regions 101, $p^+$ ions, for example, are implanted and a heat treatment is carried out at 850° C. for 30 seconds to form a diffusion layer 102. On the diffusion layer 102 and a polysilicon film (not shown) serving as gate electrodes isolated from the diffusion layer, a metal silicide layer such as a cobalt (Co) silicide layer 104 is formed. A silicon oxide film 103 of about 700 nm thick is deposited as an interlayer insulating film. In the silicon oxide film 103, contact holes are formed by anisotropic etching such as RIE, to expose the silicide layer 104.

In FIG. 1B, a barrier layer made of Ti/TiN is formed on the side wall of each contact hole. More precisely, a Ti film 105 of about 50 nm thick is formed on the sidewall of each contact hole by spattering, and on the Ti film 105, a TiN film 106 of about 10 nm thick is formed by reactive spattering. A heat treatment is carried out at about 550° C. for about 60 minutes in an $H_2/N_2$ atmosphere, to form a silicide layer 107 under each contact hole.

In FIG. 1C, a tungsten (W) film 108 is formed with $WF_6/SiH_4$ and hydrogen source gases in a reaction chamber in which a wafer, i.e., the substrate 100 is placed. The W film 108 fills a space defined by the barrier layer in each contact hole. The W film 108, TiN film 106, and Ti film 105 are polished by CMP (chemical mechanical polishing), to expose the surface of the silicon oxide film 103, thereby forming each contact.

FIG. 3 is a graph showing the contact resistance of sample semiconductor devices formed through the steps of FIGS. 1A to 1C. Each contact is 0.2 $\mu m$ in diameter. An ordinate of the graph indicates probability (%) and an abscissa thereof indicates contact resistance (Ω). The contact resistance of a sample involving Ti and TiN films is represented with a black triangle. Forming the Ti film 105 on the bottom of each contact hole reduces a natural oxide film formed at the bottom of the contact hole and forms the silicide layer 107 to reduce contact resistance.

Figure 2A:
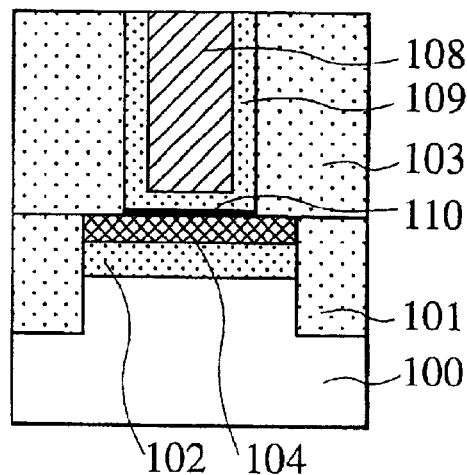
FIGS. 2A and 2B are sectional views showing semiconductor devices according to a related art and a first embodiment of the present invention, respectively.
Figure 4:
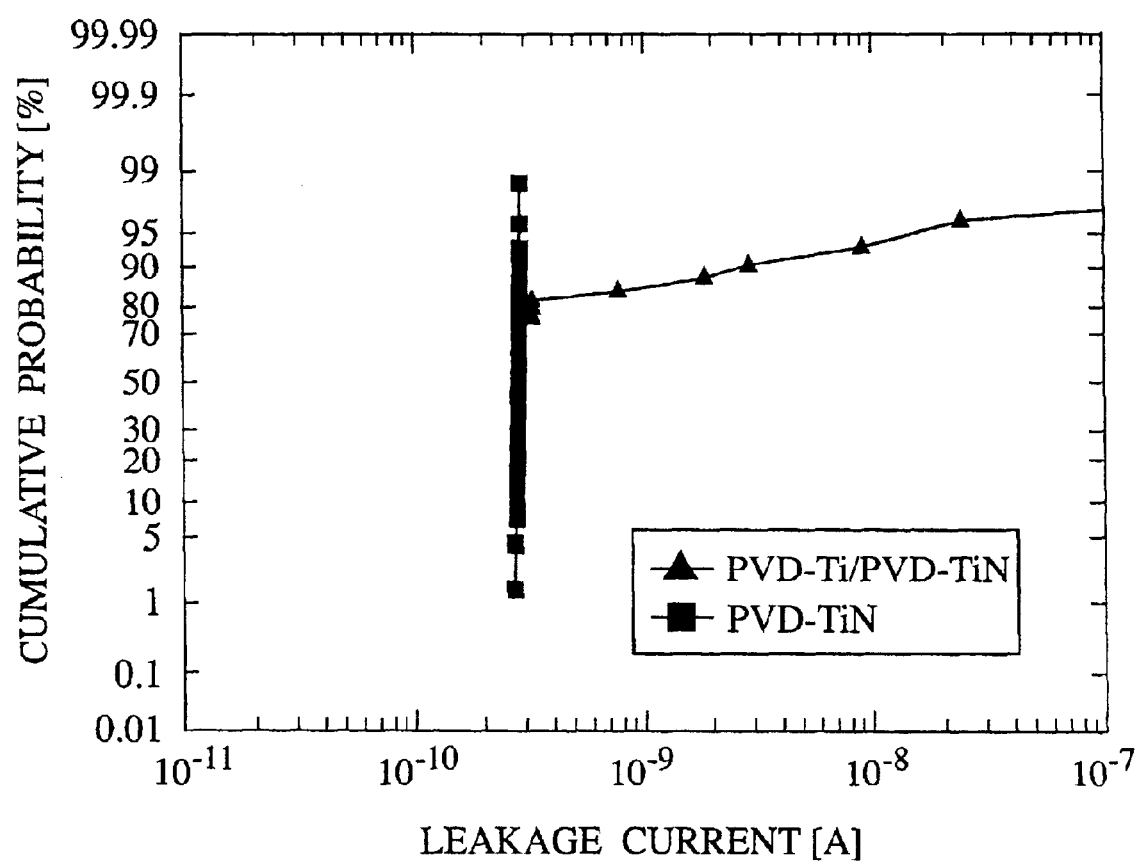
FIG. 4 is a graph showing the junction leakage current of the sample semiconductor devices.

The structure involving the Ti/TiN configuration, however, involves a high junction leakage current as shown in FIG. 4. This is because the silicide layer 107 at the bottom of each contact hole is thick with respect to the depth of a junction of the diffusion layer 102, so that a small amount of Ti diffuses toward the junction, to increase a junction leakage current. To cope with this problem, only a TiN film 109 of about 10 nm thick may be formed by reactive spattering as shown in FIG. 2A, instead of the Ti film 105 and TiN film 106 of FIGS. 1B and 1C. After forming the TiN film 109, a heat treatment is carried out at about 550 ° C. for about 60 minutes in an $H_2/N_2$ atmosphere. Thereafter, $WF_6/SiH_4$ and hydrogen source gases are supplied into the reaction chamber in which the wafer, i.e., the substrate 100 is placed, to form a W film 108 on the silicon oxide film 103 and in each contact hole. CMP is carried out to polish the W film 108 and TiN film 109, to expose the surface of the oxide film 103 and form each contact.

In FIG. 4, a black square represents the junction leakage current of a sample having a barrier layer made of only a TiN film. Each sample having a TiN film alone involves a small junction leakage current because the bottom of the contact hole is made of only the TiN film without a silicide layer 107. In FIG. 4, an abscissa indicates junction leak current (A) and an ordinate indicates cumulative probability (%). In FIG. 4, a black triangle represents the junction leakage current of a sample having a barrier layer made of Ti and TiN films.

Returning to FIG. 3, each sample having a TiN film alone shows very high contact resistance as indicated with a black square. This is because TiN is unable to reduce a natural oxide film 110 formed between the silicide layer 104 and the TiN film 109. In this way, it is difficult to simultaneously realize a low leakage current and low contact resistance.

In connection with the contact resistance, the silicide layer 107 is not needed under each contact hole if a cobalt silicide layer 104 formed on the diffusion layer 102 sufficiently functions to lower the sheet resistance of the diffusion layer 102. The cobalt silicide layer 104 will realize low resistance with respect to the metal 108 filled in the contact hole if the natural oxide film 110 formed at the bottom of the contact hole can be reduced. To reduce the natural oxide film 110, a study was made to form a TiN film 109 on the natural oxide film 110, carry out a high-temperature heating process within a short period, and check if a reaction occurs between the TiN film 109 and the natural oxide film 110. It was found that the TiN film 109 reacts with the natural oxide film 110 in a high-temperature heat treatment at 1050° C. for 30 seconds.

Such a high-temperature heat treatment, however, badly affects the impurity profile of the diffusion layer 102 at the bottom of each contact hole. Thermal diffusion is determined by the ½ power of a product of a diffusion coefficient and time. Accordingly, shortening a heat treatment period on the TiN film 109 may reduce the natural oxide film 110 without affecting the impurity profile of the diffusion layer 102. Another study was made to carry out a heat treatment at 1050° C. for 100 msec within which the impurity profile of the diffusion layer 102 was expected to be unaffected. It was found that no reduction is observed in the natural oxide film 110 and in the contact resistance. Since the metal film 109 well reflects light, a heating technique using standard lamps may be insufficient to heat the metal film 109.

Figure 5:
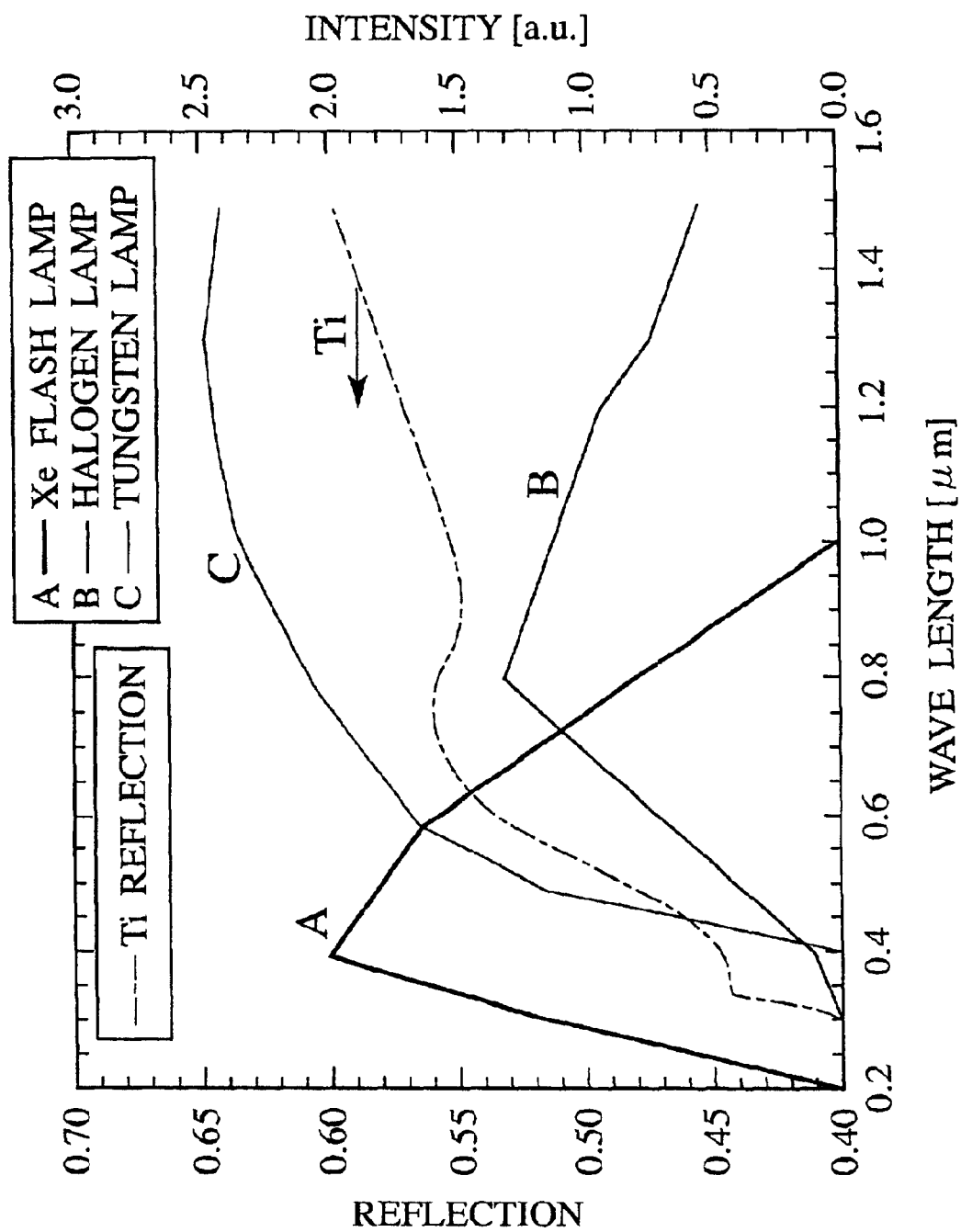
FIG. 5 is a graph showing the reflection coefficients of a Ti film with respect to light wavelengths, and the intensities of various lamps.

FIG. 5 is a graph showing the reflection coefficients of a metal (Ti) film with respect to various light wavelengths, and the intensities of various lamps. An abscissa indicates wavelengths in μm and an ordinate indicates intensities in a.u. A light source used for a standard RTA apparatus is a halogen lamp or a tungsten lamp. These lamps emit light of 800 nm or longer in wavelength. On the other hand, the reflection coefficients of metallic film such as Ti film are high with longer wavelengths. The Ti film shows low reflection coefficients with respect to wavelengths shorter than 800 nm.

As a result, the Ti film reflects most of the energy emitted from a halogen lamp, and therefore, the halogen lamp is insufficient to heat the Ti film. The shorter a heating period, the more difficult for the halogen lamp to heat the Ti film to a target temperature, and therefore, the halogen lamp must have more power to heat the Ti film to the target temperature.

In FIG. 5, a xenon (Xe) lamp has a main wavelength shorter than 800 nm, and therefore, is capable of efficiently heating the Ti film. If the wavelength of a heater lamp is shorter than 800 nm, light from the lamp will hardly be reflected by the Ti film, and therefore, will sufficiently heat the Ti film within a short period. Accordingly, an embodiment of the present invention forms a TiN film of about 10 nm thick by reactive spattering on a substrate, heats the substrate to 300 to 500° C., and heats the TiN film with an Xe lamp at 10 J/cm$^2$ for 1.3 msec in an Ar atmosphere.

Figure 6:
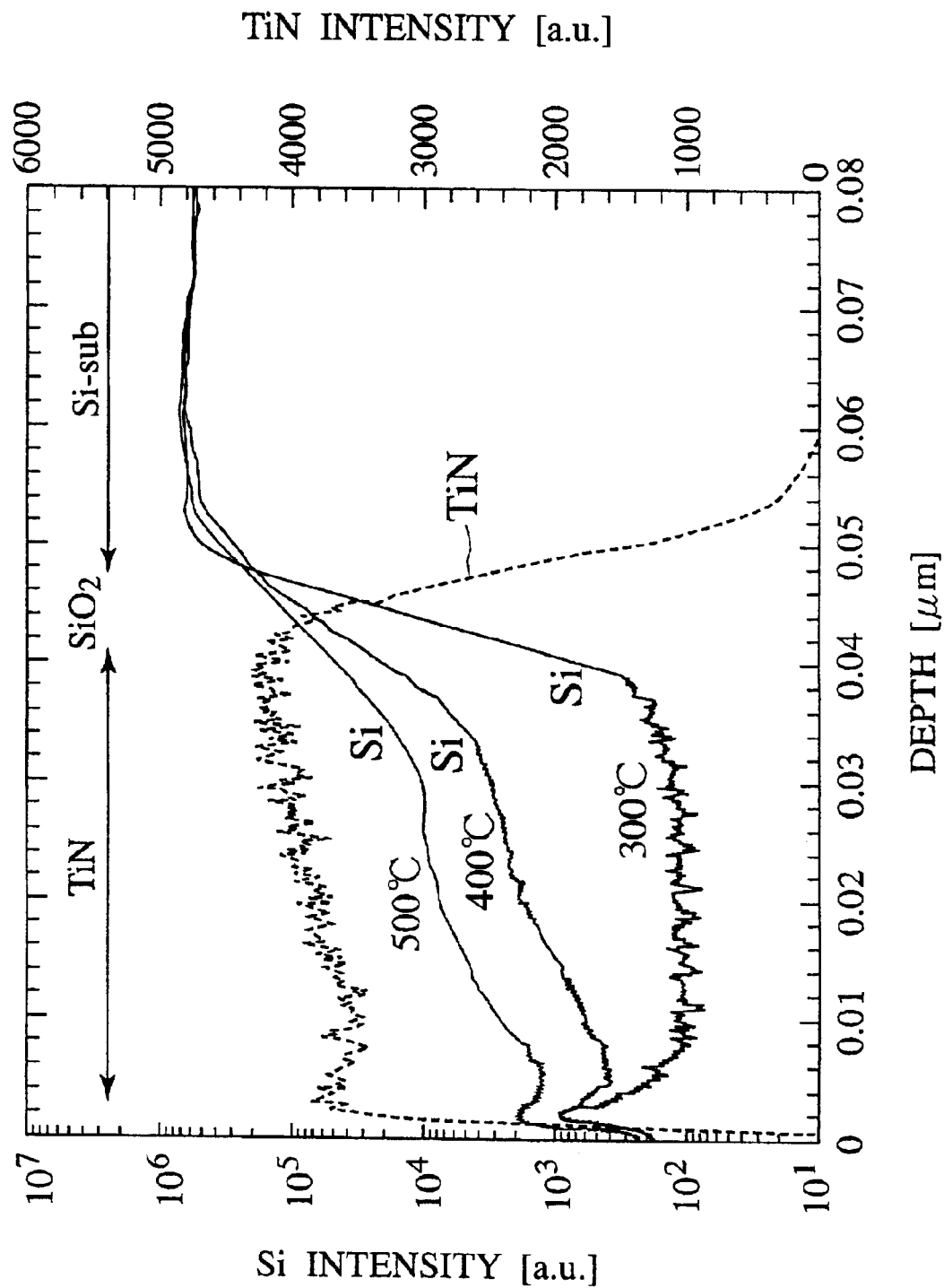
FIG. 6 is a graph showing element distributions analyzed by SIMS in a multilayered structure consisting of a silicon semiconductor substrate, a thermal oxide ($SiO_2$) film, and a TiN film.

FIG. 6 is a graph showing element distributions analyzed by SIMS in a multilayered structure consisting of a silicon semiconductor substrate, a thermal oxide (SiO$_2$) film, and a TiN film. As the temperature of the substrate is increased from 300° C. to 500° C., Si atoms diffuse into the TiN film through the thermal oxide film. In FIG. 6, an abscissa indicates depth in the multilayered structure and an ordinate indicates Si and TiN distributions.

Figure 2B:
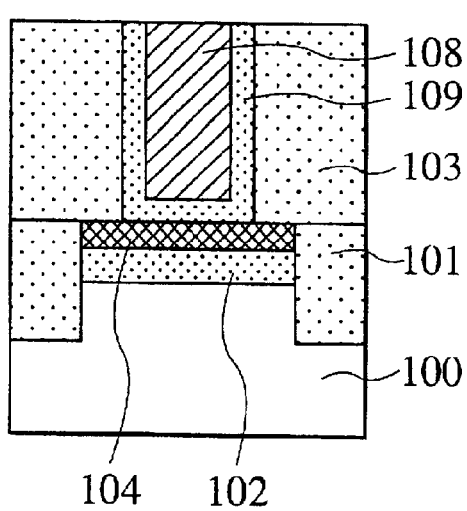

Based on the effect mentioned above found by the inventor, a semiconductor device according to a first embodiment of the present invention is manufactured through a process of FIG. 2B instead of the processes of FIGS. 1B, 1C, and 2A. In FIG. 2B, only a TiN film 109 of about 10 nm thick is formed on a semiconductor substrate 100 by reactive spattering. The substrate 100 is heated to, for example, 500° C., is kept at this temperature, and is irradiated with an Xe lamp at 10 J/cm$^2$ for 1 msec in an Ar atmosphere. In a reaction chamber in which the substrate 100 is placed, $WF_6/SiH_4$ and hydrogen source gases are supplied to form a W film 108 in each contact hole and on a silicon oxide film 103 formed on the substrate 100. CMP is carried out to polish the W film 108 and TiN film 109, to expose the surface of the oxide film 103 and form each contact. Wiring is formed on the contacts, so that the substrate 100 is electrically connected to the wiring.

Figure 7:
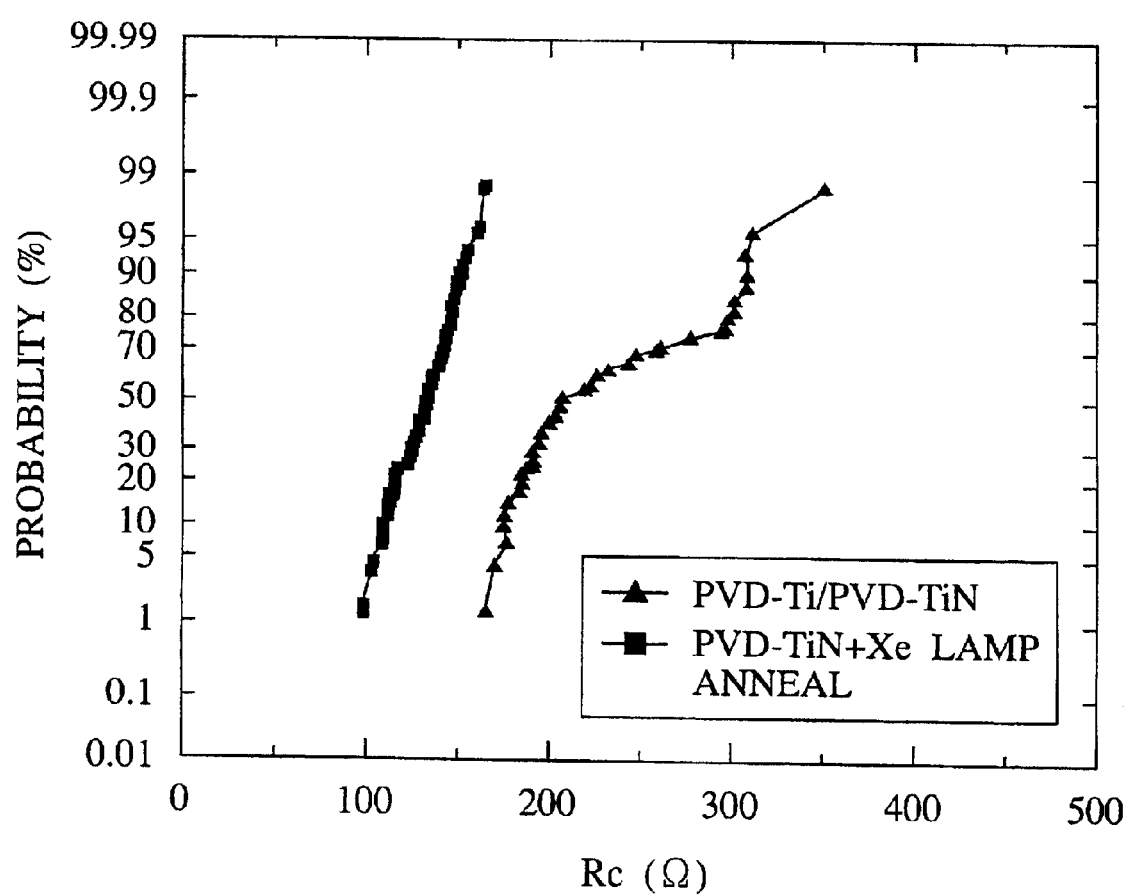
FIG. 7 is a graph showing the contact resistance of sample semiconductor devices.

In FIGS. 7 and 8, a black square represents a sample formed according to the first embodiment, having a barrier layer made of only a TiN film and annealed with an Xe lamp for a short period. Each sample according to the first embodiment shows low contact resistance in FIG. 7 and small junction leakage current in FIG. 8. In this way, the heat treatment according to the first embodiment reduces a natural oxide film formed between a TiN film and a silicide layer and forms a contact without changing the impurity profile of a diffusion layer. In FIG. 7, an abscissa indicates contact resistance (Rc) and an ordinate indicates probability (%). A black triangle represents the contact resistance of a sample having a Ti/TiN barrier. In FIG. 8, an abscissa indicates junction leakage current (A) and an ordinate indicates cumulative probability (%). A black triangle represents the junction leakage current of the sample having the Ti/TiN barrier. The results related to the first embodiment shown in FIGS. 7 and 8 will improve if the barrier layer 109 is made of a metal nitride film containing halogen.

Forming a barrier layer containing halogen (chlorine (Cl)) in this example) will be explained based on the first embodiment. Source gases such as $TiCl_4$ and $NH_3$ are used to form a TiN film 109 of about 10 nm thick by CVD on a semiconductor substrate 100. The substrate 100 is heated to 200° C. and is irradiated with an Xe lamp at 10 J/cm² for 1.3 msec in an Ar atmosphere. A heat treatment is carried out at 550° C. for 60 minutes in an $H_2/N_2$ atmosphere. A W film 108 is formed with, for example, $WF_6$, $SiH_4$, and hydrogen source gases. CMP (Chemical Mechanical Polishing) is used to polish the W and TiN films to expose an oxide film 103. Even if the temperature of the substrate 100 is low, the TiN film 109 made by CVD is able to achieve low contact resistance and small junction leakage current like a TiN film made by PVD. The TiN film 109 made by CVD using $TiCl_4$ and $NH_3$ source gases contains a large amount of Cl. To remove Cl from the TiN film 109, a heat treatment must be carried out at 600° C. or higher. For this purpose, the light source according to the embodiment effectively heats the TiN film 109, to remove Cl even at low temperatures. At this time, Ti atoms decoupled from Cl atoms move toward the silicon substrate 100 due to thermal diffusion. The diffused Ti atoms are small in quantity but are sufficient to reduce a natural oxide film 110 formed between the TiN film 109 and the silicon substrate 100. As a result, low contact resistance is realized without forming a Ti film under the TiN film 109.

Although the first embodiment employs a rare gas such as an Ar gas to carry out heat treatment, it may employ a reducing atmosphere to trigger a reaction at lower temperatures. For example, an atmosphere containing $NH_3$, $H_2$, and $B_2H_4$ is employable to achieve the heat treatment of the first embodiment. Although the first embodiment employs a TiN film as a metal nitride film, it may employ a metal nitride film containing tantalum (Ta), niobium (Nb), vanadium (V), hafnium (Hf), zirconium (Zr), or an alloy including thereof providing the effect of the first embodiment. With these materials, the first embodiment triggers a reaction between a TiN film and a substrate to reduce a natural oxide film.

Figure 9A:
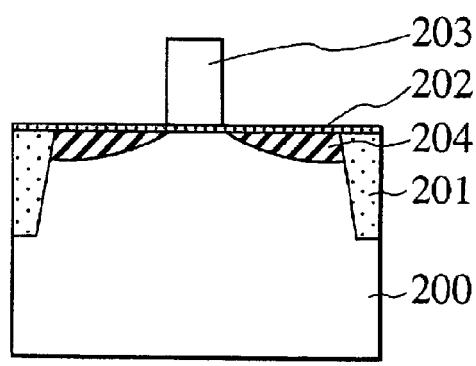
FIGS. 9A, 9B, 10A, and 10B are sectional views showing a semiconductor device in different manufacturing steps according to a second embodiment of the present invention.
Figure 9B:
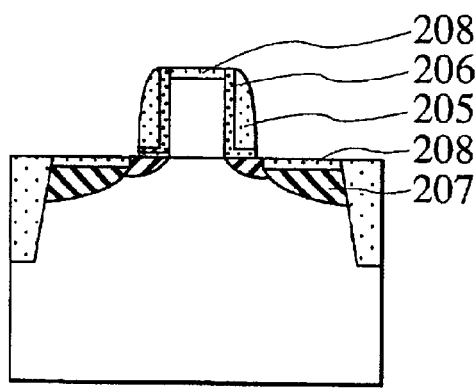

A semiconductor device and a method of manufacturing the semiconductor device according to a second embodiment of the present invention will be explained with reference to sectional views of FIGS. 9A to 10B and in comparison with a prior art. The semiconductor device of the second embodiment includes a MOS transistor. In FIG. 9A, a semiconductor substrate 200 is made of a silicon monocrystal and has element isolation regions 201 such as STI regions. On the substrate 200, a silicon oxide film 202 is formed. On the silicon oxide film 202, a polysilicon film 203 is formed. The polysilicon film 203 is anisotropically etched by, for example, RIE to form gate electrodes. $As^+$ ions, for example, are implanted and a heat treatment is carried out at 950° C. for 30 seconds to form a diffusion layer 204. In FIG. 9B are deposited on the substrate 200 and are etched back to form the side walls of each gate electrode, i.e., the polysilicon film 203. $P^+$ ions, for example, are implanted and a heat treatment is carried out at 850° C. for 30 seconds to form a diffusion layer 207 serving as source/drain regions. On the diffusion layer 207 and polysilicon layer 203, a cobalt (Co) silicide layer 208 is formed.

Figure 10A:
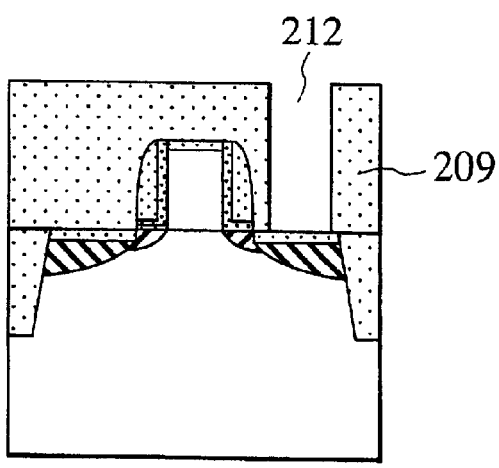

In FIG. 10A, a silicon oxide film is formed as an interlayer insulating film 209 over the substrate 200. CMP, for example, is employed to flat the interlayer insulating film 209. The interlayer insulating film 209 is patterned to open each contact hole 212.

Figure 10B:
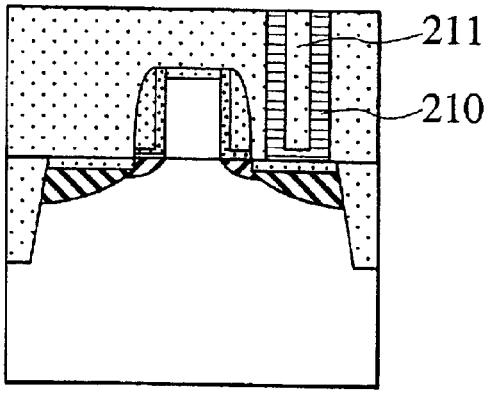

In FIG. 10B, reactive spattering, for example, is employed to form a ZrN film 210. The substrate 200 is heated to 500° C. in, for example, an $NH_3$ atmosphere and is heated with a xenon (Xe) lamp at 10 J/cm² for 1 msec in an Ar atmosphere.

$WF_6$, $SiH_4$, and hydrogen source gases are used to form a W film 211. CMP is employed to polish the W film 211 and ZrN film 210, to expose the surface of the interlayer insulating film 209. This forms a contact of low resistance and low leakage current and a transistor having low resistance and low junction leakage current.

Figure 11A:
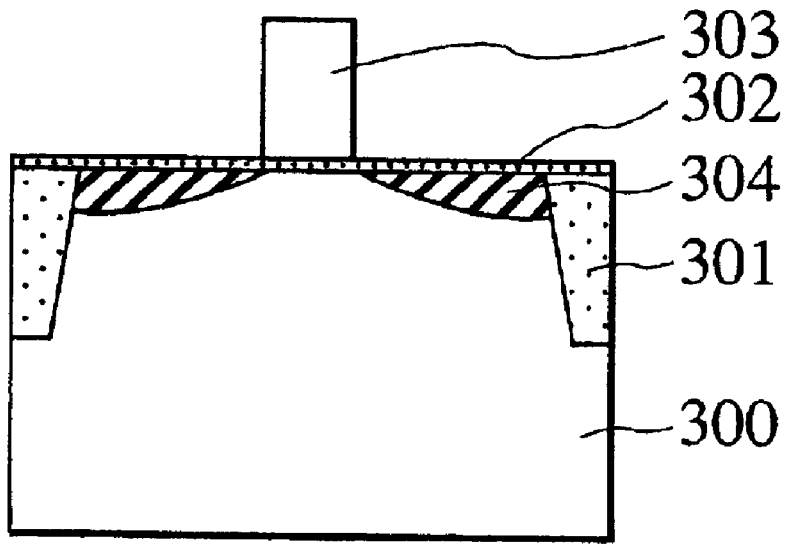
FIGS. 11A, 11B, and 12A to 12C are sectional views showing a semiconductor device in different manufacturing steps according to a third embodiment of the present invention.

A semiconductor device and a method of manufacturing the semiconductor device according to a third embodiment of the present invention will be explained with reference to sectional views of FIGS. 11A to 13B and a junction leakage current graph of FIG. 14. The third embodiment involves a salicide process and is explained in comparison with a prior art. In FIG. 11A, a semiconductor substrate 300 is made of a silicon monocrystal and has element isolation regions 301 such as STI regions. On the substrate 300, a silicon oxide film 302 serving as a gate insulating film is formed. On the silicon oxide film 302, a polysilicon film 303 is formed. The polysilicon film 303 is anisotropically etched by, for example, RIE to form each gate electrode. $As^+$ ions, for example, are implanted into the substrate 300 and a heat treatment is carried out at 950° C. for 30 seconds to form a diffusion layer 304.

Figure 11B:
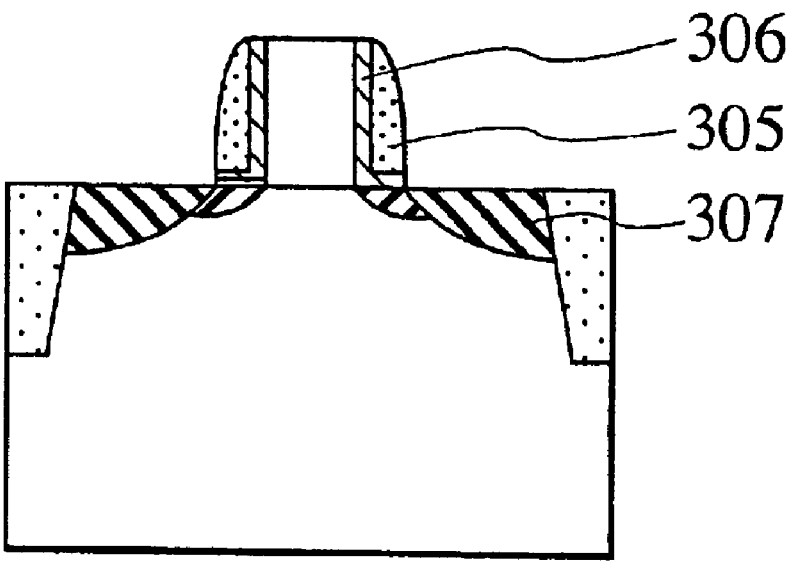

In FIG. 11B, a silicon oxide film 306 and a silicon nitride film 305 are formed on the substrate 300 and are etched back to form the side walls of the gate electrode, i.e., the polysilicon film 303. $P^+$ ions, for example, are implanted into the substrate 300 and a heat treatment is carried out at 850° C. for 30 seconds to form a diffusion layer 307 serving as source/drain regions.

Figure 12A:
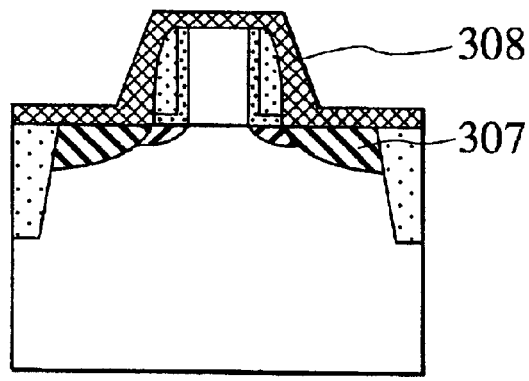
Figure 12B:
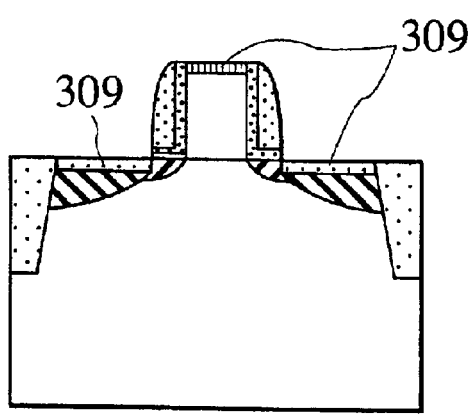

In FIG. 12A, a metal film such as a cobalt (Co) film 308 is made on the diffusion layer 307 and polysilicon film 303. In FIG. 12B, a first heating process is carried out at, for example, 450° C. for 30 seconds to form a cobalt monosilicide (CoSi) layer 309. A mixture of sulfuric acid and hydrogen peroxide, for example, is used to remove an unreacted Co film from the sidewalls of the gate 303, etc.

Figure 12C:
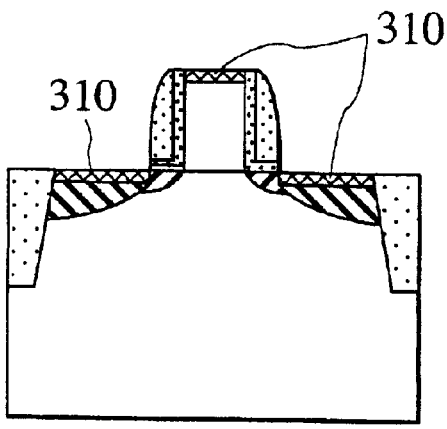

In FIG. 12C, a second heating process is carried out on the substrate 300 under the conditions of, for example, 815° C. and 30 seconds to form a cobalt disilicide ($CoSi_2$) layer 310.

Figure 13A:
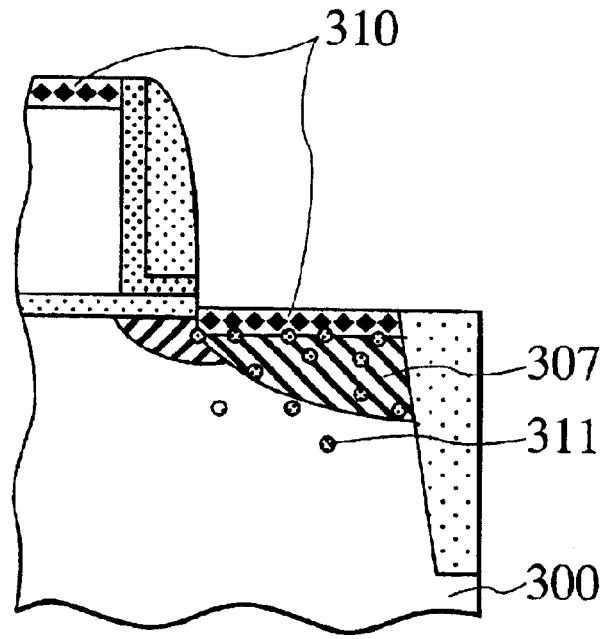
FIG. 13A is a sectional view showing Co diffusion due to heat treatment.
Figure 14:
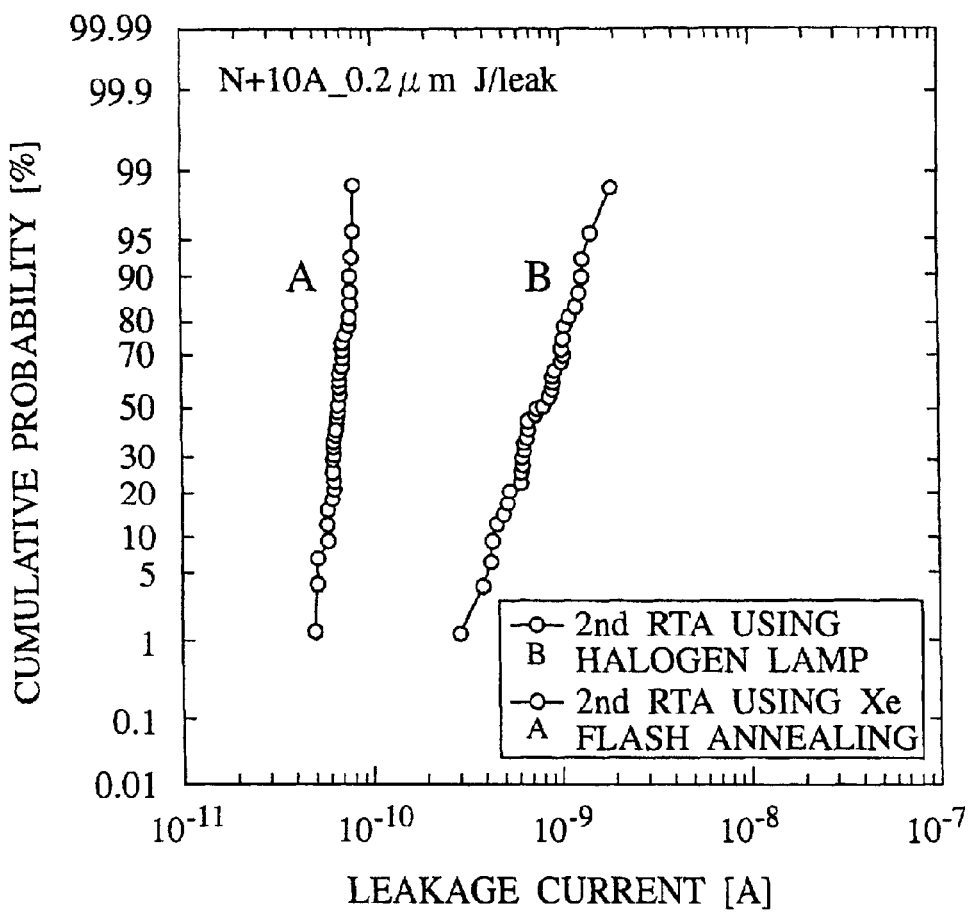
FIG. 14 is a graph showing the junction leakage current of semiconductor devices formed according to the present invention and a prior art.

It is known, however, that the second heating process diffuses a small amount of Co atoms 311 toward the substrate 300 as shown in FIG. 13A. The Co atoms form a deep level in Si. If the Co atoms 311 diffuse to a junction of the diffusion layer 307 under the $CoSi_2$ layer 310, a junction leakage current will increase. To prevent this, the $CoSi_2$ layer 310 must be distanced from the junction of the diffusion layer 307 by about 100 to 150 nm.

As transistors become finer, diffusion layers become shallower. Then, it becomes difficult to keep a proper distance between the silicide layer and the junction. The basics of this problem are that Co atoms diffuse into the substrate due to heat before the formation of the thermally stable $CoSi_2$ layer. The problem is avoidable, therefore, if the CoSi layer can quickly be changed into the $CoSi_2$ layer before Co atoms diffuse into the substrate.

Figure 13B:
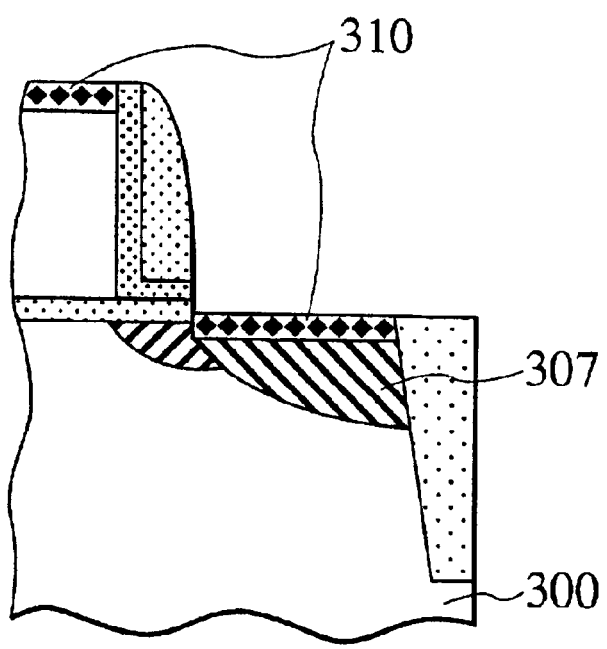
FIG. 13B is a sectional view showing the semiconductor device according to the third embodiment.

Accordingly, the third embodiment heats the substrate 300 to 500° C. and carries out a third heating process with an Xe lamp at 10 J/Cm² for 10 msec in an Ar atmosphere, to form the $CoSi_2$ layer 310. As explained before, the Xe lamp has a main wavelength shorter than 800 nm, to efficiently heat a metal film. In FIG. 13B, no Co atoms are diffused into the substrate 300, while the CoSi layer 309 is changed into the thermally stable $CoSi_2$ layer 310. As a result, the distance between the $CoSi_2$ layer 310 and the diffusion layer 307 can be reduced shorter than 100 nm. In FIG. 14, the heat treatment with an Xe lamp (flash lamp)

dramatically decreases a junction leakage current as indicated with a curve A compared with a prior art of curve B without an Xe lamp. In FIG. 14, an abscissa indicates junction leakage current (A) and an ordinate indicates cumulative probability (%). The cobalt film is employed as a metal film in this embodiment. Also, titan (Ti), nickel (Ni), hafnium (Hf), zirconium (Zr), palladium (Pd), or platinum (Pt) can be employed as a metal film in the embodiment.

Figure 15:
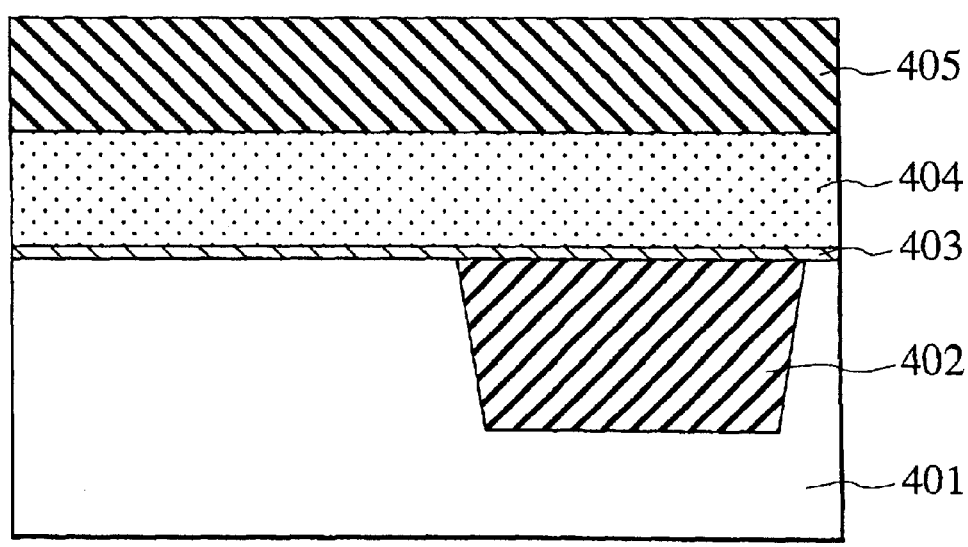
FIG. 15 is a sectional view showing a semiconductor substrate according to a fourth embodiment of the present invention.
Figure 20:
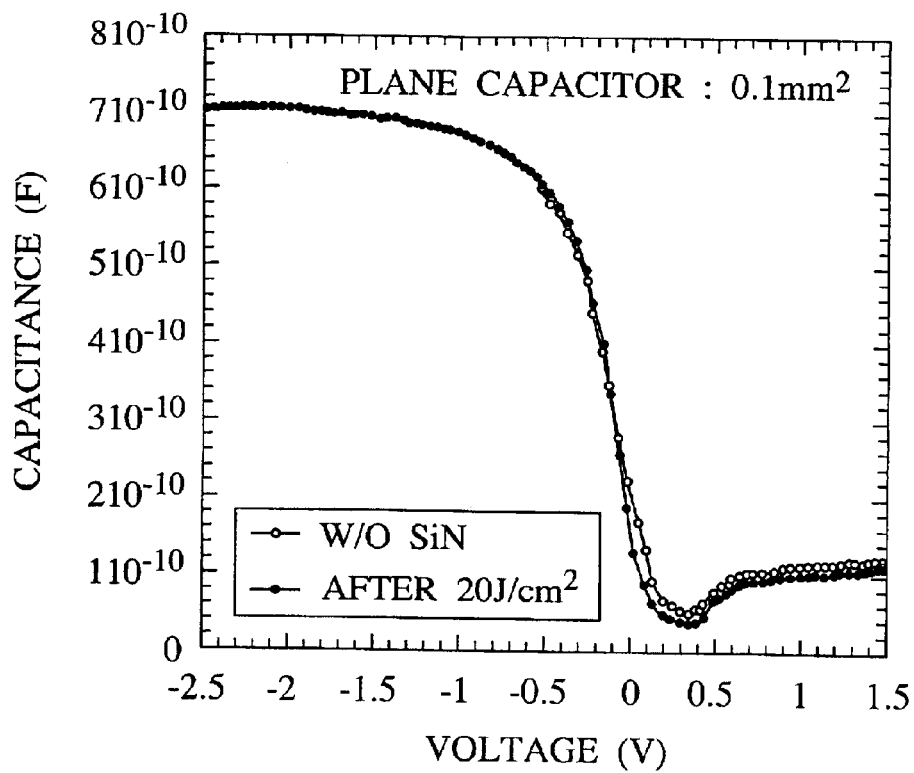
FIG. 20 is a graph showing the C-V curves of PMOS elements with and without an SiN film formed according to the fourth embodiment.
Figure 21:
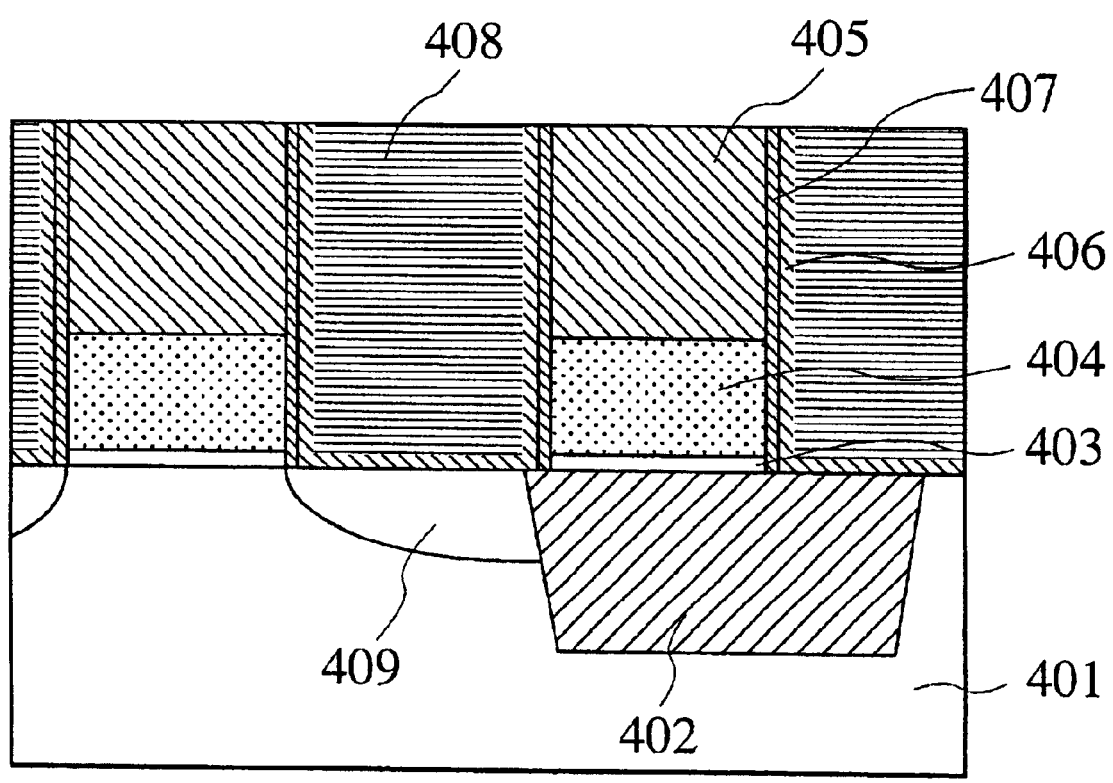
FIG. 21 is a sectional view showing the semiconductor substrate of the semiconductor device according to the fourth embodiment.

A semiconductor device and a method of manufacturing the semiconductor device according to a fourth embodiment of the present invention will be explained with reference to FIGS. 15 to 21 in which FIGS. 15 and 21 are sectional views showing a PMOS area of a DRAM element in the semiconductor device of the fourth embodiment. In FIG. 15, a semiconductor substrate 401 has an element isolation region 402 such as an STI region formed by a standard semiconductor manufacturing process. A gate oxide/nitride film 403 of about 5 nm thick is formed on the substrate 401. On the gate oxide/nitride film 403, an amorphous silicon film 404 of about 70 nm thick is formed by CVD at a reaction temperature of 550° C. A standard patterning technique is used to expose a PMOS area, and boron is implanted at 5 keV and 1.0e15. A photoresist used for the standard patterning technique is removed, and an annealing process is carried out at 800° C. for about 30 minutes in a nitrogen atmosphere to change the amorphous silicon film 404 into a polysilicon film.

An SiN film 405 of about 200 nm thick is formed. The SiN film 405 serves as a hard mask to open contact holes in a self-aligning manner The SiN film 405 may be formed by any method, for example CVD. The CVD employs hexachlorosilane (HCD) as a silicon source and triggers a reaction between the HCD and ammonia to form the SiN film 405 at a film forming temperature of 600° C., an HCD/ammonia flow ratio of 1000 (sccm)/50 (sccm), and a film forming pressure of 0.3 Torr. The hexachlorosilane (HCD) is employed as a silicon source in this embodiment. Also, dichlorosilane can be employed as a silicon source in the embodiment. Just after the formation, the SiN film 405 contains hydrogen as NH bond of 3.1e21 cm$^{-3}$ and SiH bond of 3.1e21cm$^{-3}$. At this time, white light of 200 nm or longer in wavelength is emitted at 20 J/cm² or over for 3 msec or shorter, to irradiate the SiN film 405 preferably in an inert gas. At this time, the substrate 401 is heated to 300° C. or higher. Emitting a large amount of photons within a short period decouples SiH bond and NH bond in the SiN film 405, and free hydrogen atoms are bonded together to form hydrogen molecules that escape from the SiN film 405.

Figure 16A:
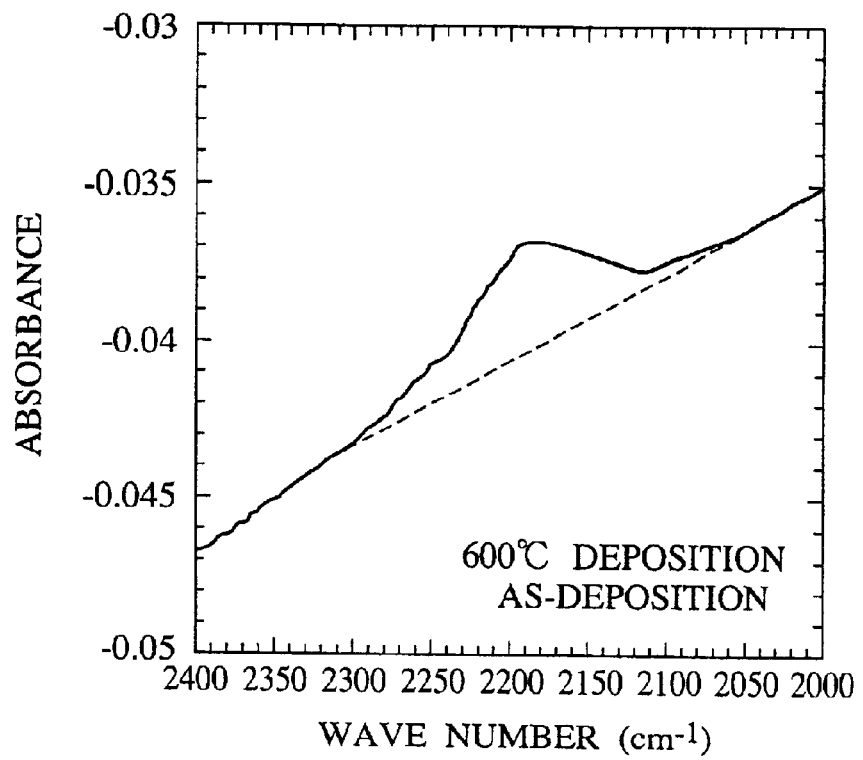
FIGS. 16A and 16B are graphs showing the FT-IR spectrums of an SiN film before and after a heat treatment according the fourth embodiment.
Figure 16B:
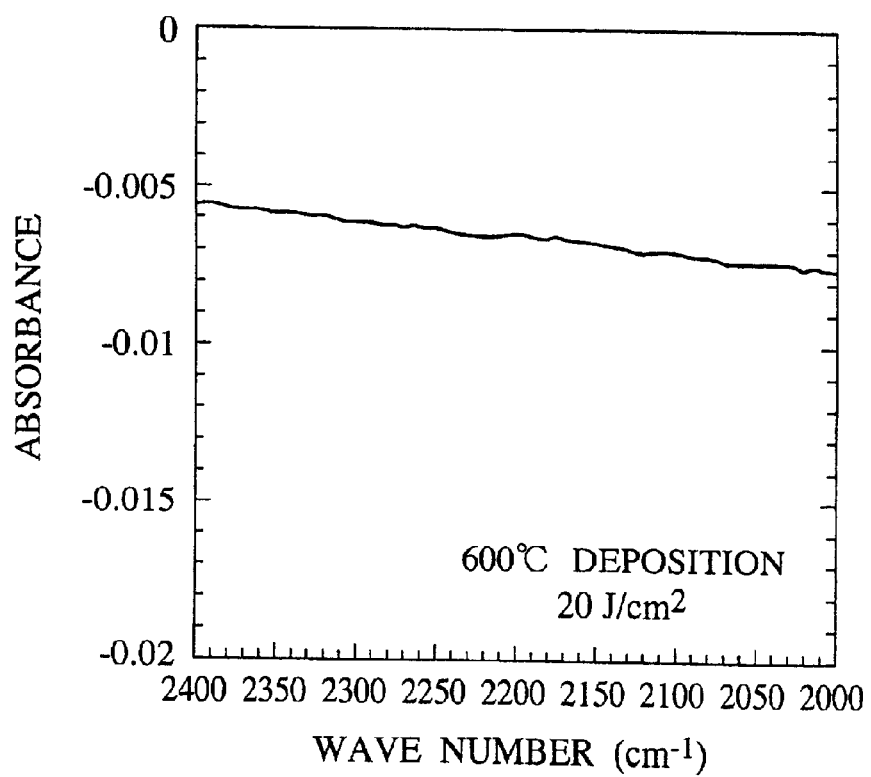
Figure 17:
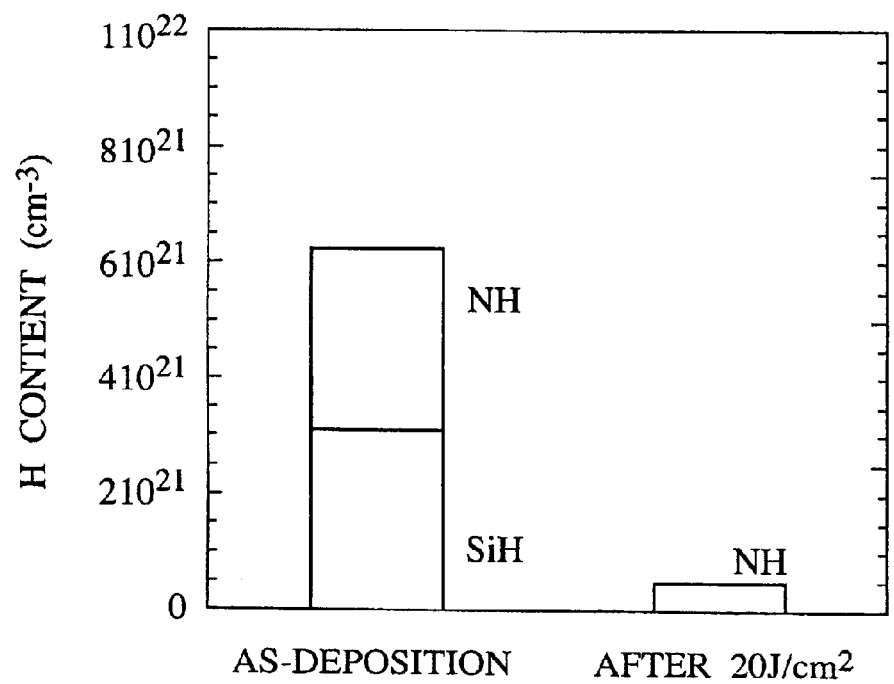
FIG. 17 is a graph showing the hydrogen content of an SiN film before and after a heat treatment according to the fourth embodiment.

FIGS. 16A and 16B show FT-IR spectrums in the SiN film just after the formation and after irradiated with light. FIGS. 16A and 16B particularly show SiH bond. An abscissa indicates wave number (cm$^{-1}$) and an ordinate indicates absorbance. The figures show that the light emission conditions mentioned above minimize SiH bond in the SiN film 405 below a detective limit. FIG. 17 shows hydrogen content in the SiN film measured by IR. An ordinate indicates hydrogen content (cm$^{-3}$) and an abscissa indicates an as-deposited state and an after-light-emission state. Although the SiN film contains a small amount of NH bond after the emission of light of 20 J/cm², SiH bond are reduced below a detective limit.

Figure 18:
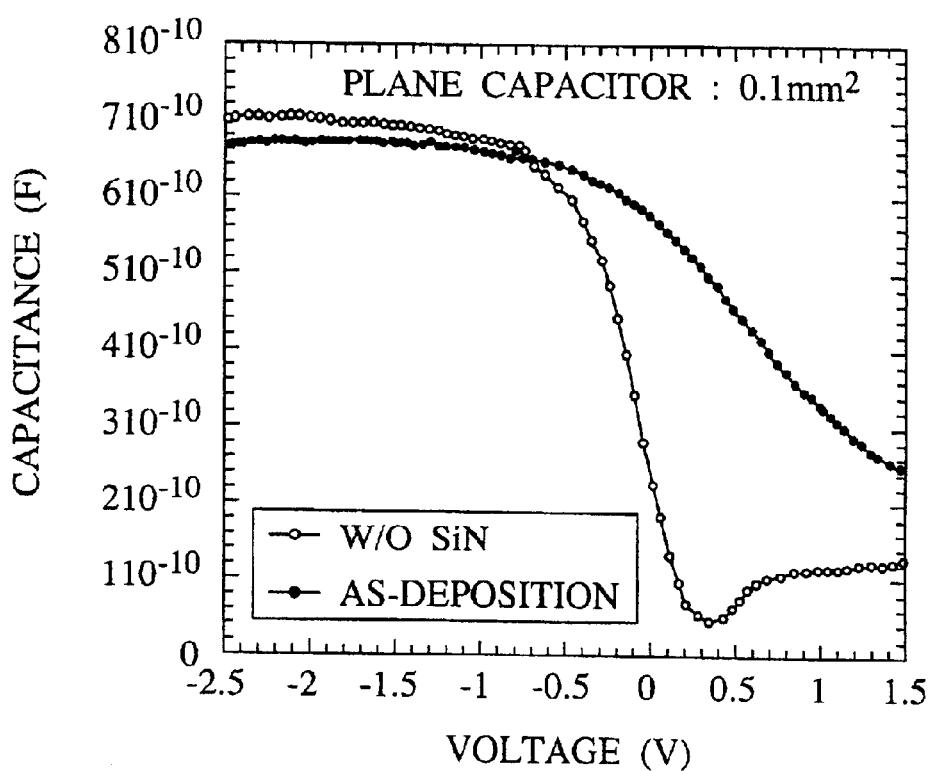
FIG. 18 is a graph showing the C-V curves of PMOS capacitors with and without an SiN film formed according to a prior art.

The electric characteristics of a PMOS element having the SiN film whose hydrogen has been reduced by light irradiation will be explained. The PMOS element having the SiN film is processed through the high-temperature post-heat treatment to remove hydrogen from the SiN film. This may cause a boron punch-through phenomenon to deteriorate the characteristics of the PMOS element. If the boron punch-through occurs, the PMOS element will suffer from an electrode depletion, a threshold voltage shift, and threshold voltage variations over a substrate. These are caused by hydrogen expelled from the SiN film, the expelled hydrogen rapidly diffusing boron atoms, which pass through a gate insulating film to reach a substrate. FIG. 18 shows the C-V curves of PMOS elements evaluated according to plane capacitors. An abscissa indicates voltage (V) and an ordinate indicates capacitance (F). A black-dot curve represents a PMOS element having an SiN film as deposited. A white-dot curve represents a reference PMOS element without an SiN film. The black-dot curve gently drops around 0 V and extends toward the positive side, to indicate that the C-V characteristics of this PMOS element are severely deteriorated and that this PMOS element involves a C-V curve shift and an electrode depletion.

Figure 19:
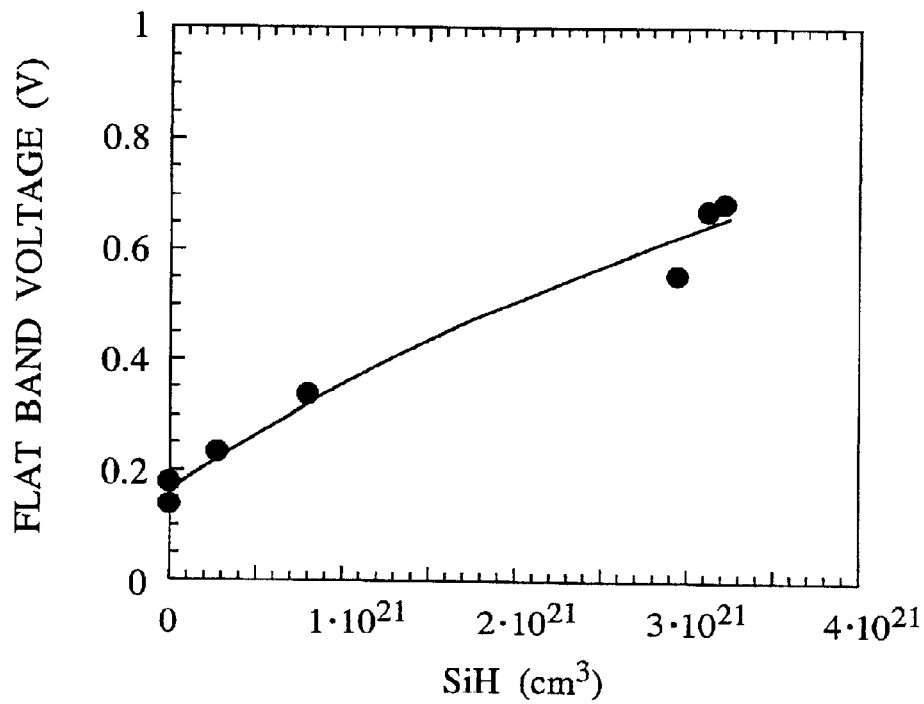
FIG. 19 is a graph showing a relationship between SiH bond and Vfb of a PMOS element.

FIG. 19 shows the SiH dependency of the flat band voltage (Vfb) of a PMOS element. An abscissa indicates the quantity of SiH bond (cm$^{-3}$) and an ordinate indicates Vfb. It is understood that the PMOS element deteriorates in proportion to the quantity of SiH bond contained in the SiN film of the PMOS element. To stop the deterioration of the PMOS element, the SiH bond must be reduced. Reducing the SiH bond is achievable by irradiating the SiN film with light. The C-V characteristics of a PMOS element having an SiN film irradiated with light is shown in FIG. 20. An abscissa indicates voltage (V) and an ordinate indicates capacitance (F). A black-dot curve represents the C-V characteristics of the PMOS element with the SiN film irradiated with light of 20 J/cm² according to the fourth embodiment. A whit characteristics of a reference PMOS element without an SiN film. It is understood that the PMOS element according to the fourth embodiment shows no deterioration because the light irradiation has reduced SiH bond in the SiN film.

After reducing SiH bond in the SiN film by light irradiation, the fourth embodiment carries out standard semiconductor device manufacturing processes to complete a semiconductor device having DRAM elements as shown in FIG. 21. This figure is a sectional view showing a PMOS area of the semiconductor device. As explained above, the substrate 401 has the element isolation region 402 that defines an element area. The element area includes a diffusion layer 409 serving as a source/drain region. On the gate oxide/nitride film 403, there is a multi-layered structure consisting of the polysilicon film 404 and the silicon nitride (SiN) film 405. This multi-layered structure is patterned into gates. On the sidewall of each gate, a spacer SiN film 406 is formed. On the spacer SiN film 406, a liner SiN film 407 is formed. Between the gates, there is a contact made of a polysilicon film 408.

According to the fourth embodiment, the SiN film 405 involves a reduced hydrogen content, in particular, SiH bond, to prevent the deterioration of PMOS elements. Although the embodiment relates to DRAM elements, the present invention is also applicable to any elements that involve a boron-added polysilicon film on which an SiN film is formed to require a high-temperature post-heat treatment.

Figure 22A:
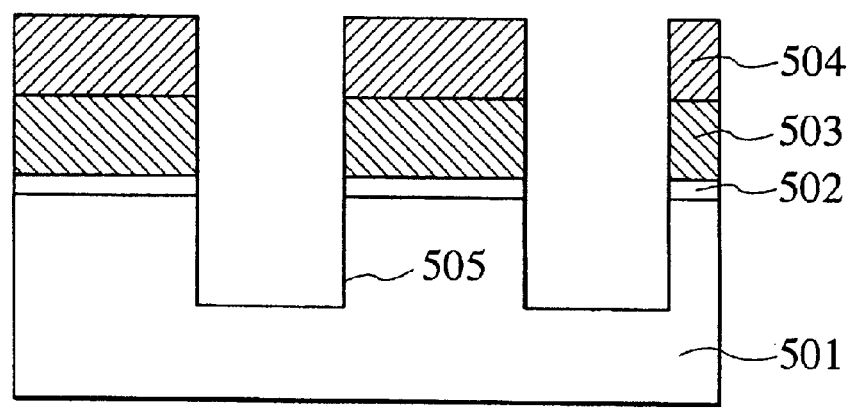
FIGS. 22A to 22C, 23A, and 23B are sectional views showing a semiconductor device in different manufacturing steps according to a fifth embodiment of the present invention.
Figure 22B:
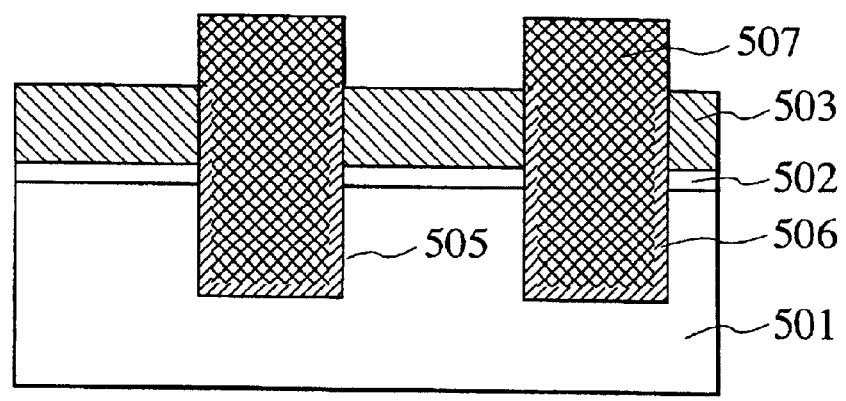

A semiconductor device and a method of manufacturing the semiconductor device according to a fifth embodiment of the present invention will be explained with reference to FIGS. 22A to 23B. The semiconductor device of this embodiment is an EEPROM. In FIG. 22A, a silicon oxide film 502 of 8 nm thick serving as a tunnel oxide film is formed on a silicon semiconductor substrate 501. A polysilicon film 503 of about 200 nm thick serving as a floating gate electrode is formed on the silicon oxide film 502 by standard CVD. A silicon nitride film 504 of 200 nm thick serving as a mask is formed by using $SiH_2Cl_2$ and $NH_3$ at 780° C. A patterned photoresist is used to form element isolation grooves 505 by standard lithography. The patterned photoresist is removed. In FIG. 22B, an oxide film 506 of 6 nm thick is formed by rapid thermal oxidization at 1050° C. The grooves 505 are filled with a silicon oxide film 507 of 500 nm thick, to form element isolation regions. CMP is employed to remove unnecessary part of the silicon oxide film 507, and the silicon nitride film 504 is removed with hot phosphoric acid.

Figure 22C:
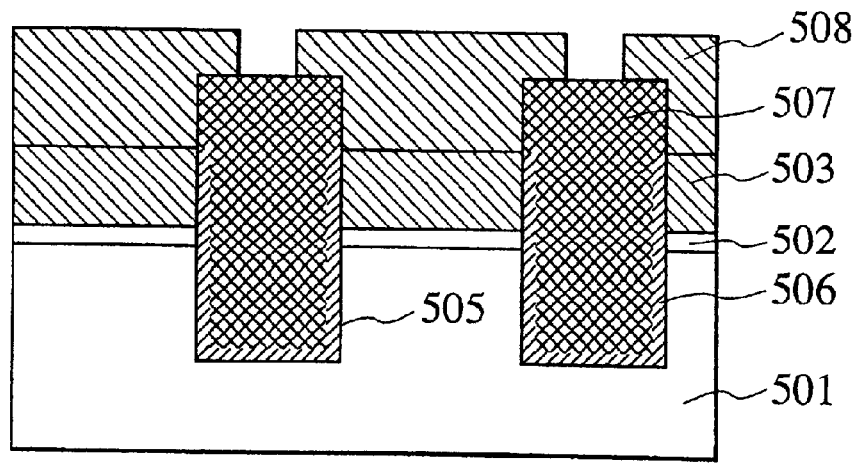
Figure 23A:
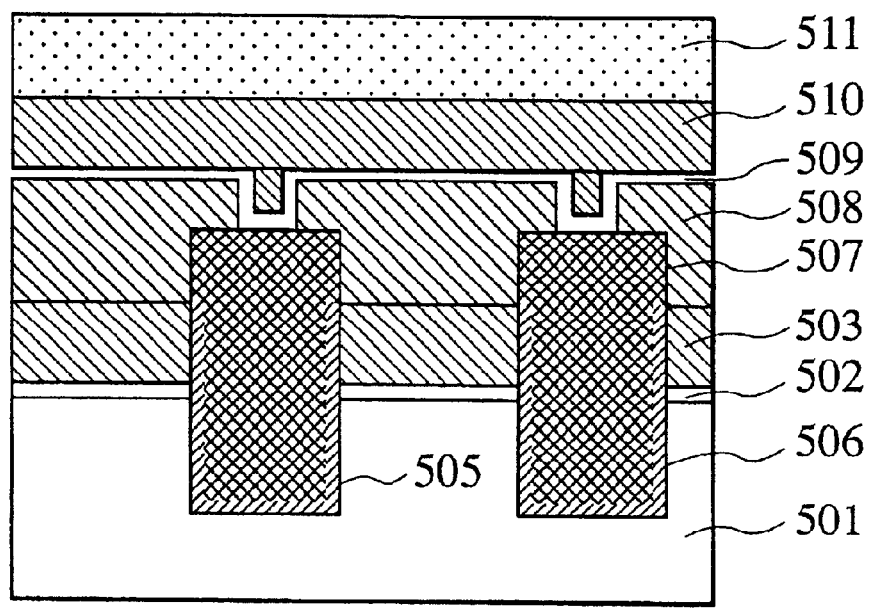
Figure 23B:
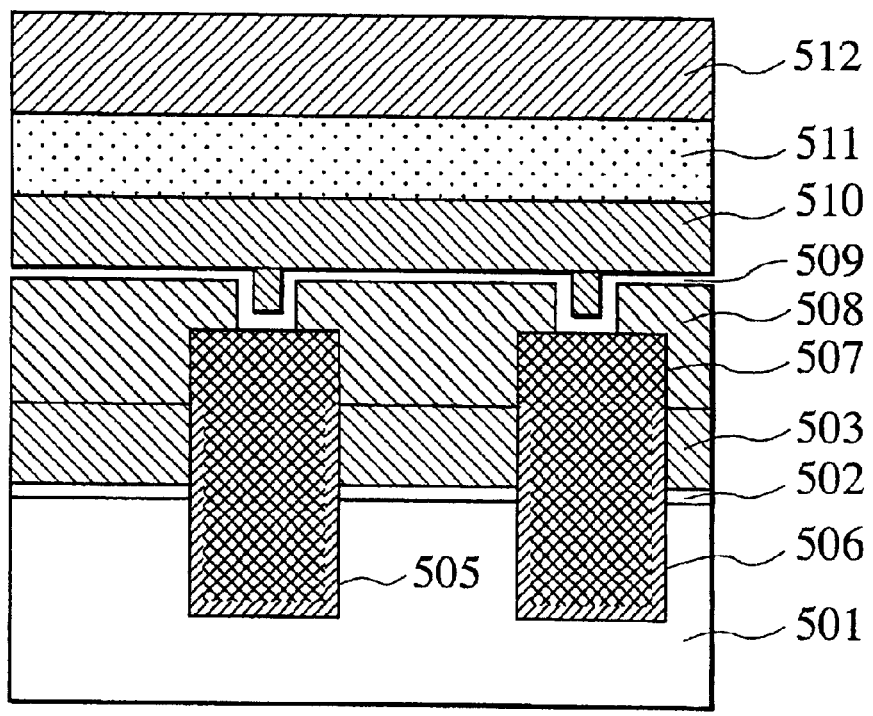
Figure 24:
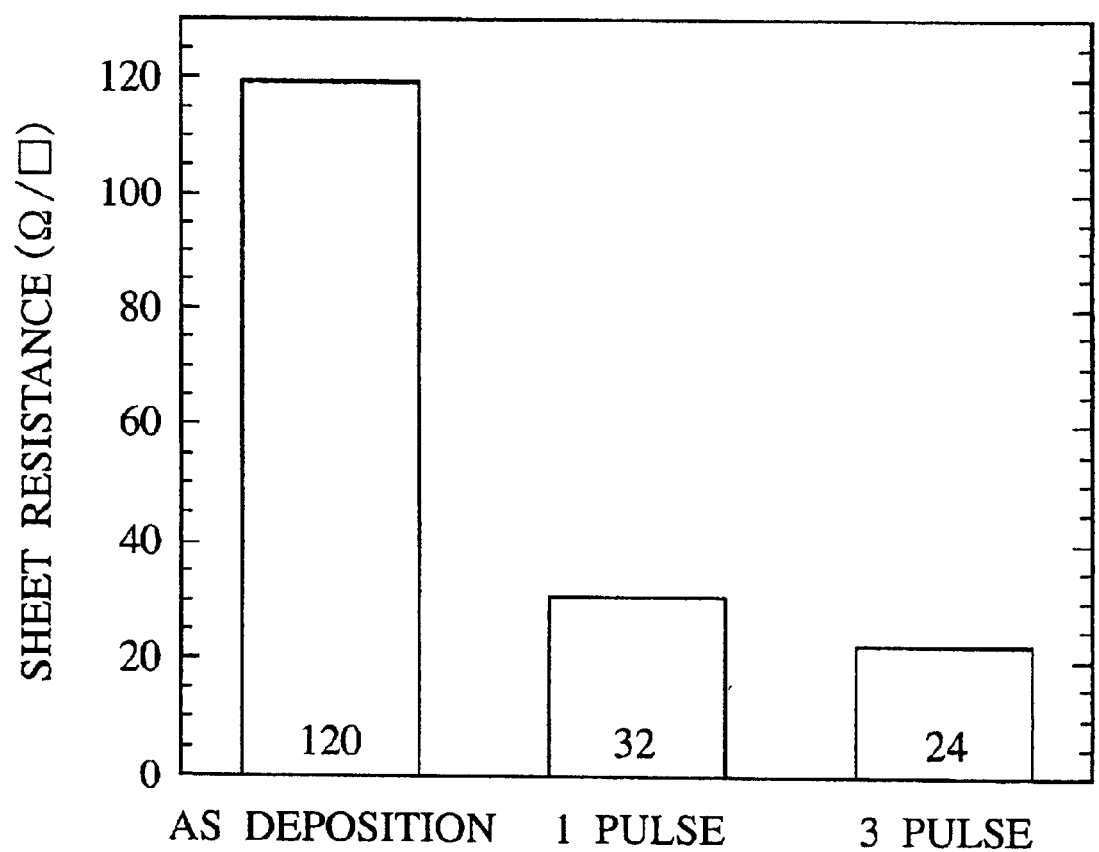
FIG. 24 is a graph showing the sheet resistance of WSi films processed according to a prior art and the fifth embodiment.

In FIG. 22C, a polysilicon film 508 of 100 nm thick serving as a second floating gate electrode is formed by CVD. In FIG. 23A, standard lithography is used to form a floating gate electrode. In FIG. 23B, an ONO ($SiO_2$/SiN/$SiO_2$) film 509 serving as an inter-electrode insulating film is formed. The ONO film 509 is a multilayered film consisting of an oxide film of 6 nm thick, a nitride film of 8 nm thick, and an oxide film of 6 nm thick. A polysilicon film 510 of 50 nm thick serving as a control electrode is formed. A WSi film 511 of 50 nm thick is formed by spattering. White light of 200 nm in wavelength or longer is emitted at 20 $J/cm^2$ or over within 3 msec, to irradiate the WSi film 511. At this time, the substrate 501 is heated to 300° C. or higher. The light emission is preferably carried out in an inert gas. FIG. 24 shows the sheet resistance of the WSi film 511. In FIG. 24, an "as-deposition" bar indicates the WSi film without light irradiation, a "1 pulse" bar indicates the WSi film irradiated with a pulse of light at $20/cm^2$, and a "3 pulses" bar indicates the WSi film irradiated with 3 pulses of light at $20J/cm^2$. An ordinate represents the sheet resistance ($\Omega$/square) of the WSi film. A decrease in the sheet resistance occurs because the light irradiation increases the temperature of only the WSi film 511 to enlarge the particle size of WSi into a monocrystal.

According to a prior art, a decrease in the sheet resistance of a WSi film is achieved with an RTA (rapid thermal annealing) apparatus. The 1-pulse irradiation and 3-pulse irradiation of the fifth embodiment correspond to an RTA operation at 950° C. for 30 seconds and an RTA operation at 1050above, reducing sheet resistance at the RTA temperatures deteriorates the characteristics of a gate insulating film.

According to the fifth embodiment, the light irradiation increases the temperature of the WSi film 511 having a high heat conductivity to 1000° C. or higher. However, the temperature of the gate insulating film 502 below the WSi film 511 is not increased above the substrate temperature. Accordingly, the embodiment can reduce the sheet resistance of the WSi film 511 without deteriorating the characteristics of the gate insulating film 502. Although the embodiment relates to WSi, the resistance reducing technique of the present invention is applicable to other metals.

In summary, the present invention carries out, when manufacturing a semiconductor device, a heat treatment for a very short period to promote a reaction between a TiN film and a semiconductor substrate to reduce a natural oxide film without deteriorating the impurity profile of a diffusion layer. The present invention also carries out, when manufacturing a semiconductor device, a heat treatment to change a metal monosilicide layer into a metal disilicide layer that is thermally stable, without diffusing metal atoms into a substrate. The present invention also carries out, when manufacturing a semiconductor device, a heat treatment to reduce hydrogen in an SiN film without deteriorating the characteristics of semiconductor elements. The present invention also carries out, when manufacturing a semiconductor device, a heat treatment to reduce the resistance of a WSi film without deteriorating the characteristics of semiconductor elements.

Various modifications will become possible for those skilled in the art after receiving the teachings of the present disclosure without departing from the scope thereof.

What is claimed is:

1. A method of manufacturing a semiconductor device, comprising:
    forming an insulating film on a silicide layer formed at the surface of a silicon semiconductor substrate;
    etching the insulating film to form a contact hole in which the silicide layer is exposed;
    forming a metal nitride film on the bottom and side wall of the contact hole;
    carrying out a first heating process at 600° C. or lower on the substrate;
    carrying out, during the first heating process, a second heating process for 10 msec or shorter with light whose wavelength is shorter than a light absorption edge of silicon;
    forming a contact conductor in the contact hole after the second heating process; and
    forming, on the insulating film, wiring that is electrically connected to the substrate through the contact conductor;
    wherein during the second heating process the silicide layer is converted from a mono-silicide to a di-silicide layer.

2. The method as claimed in claim 1, wherein the metal nitride film contains at least one of titanium, tantalum, niobium, vanadium, hafnium, and zirconium.

3. The method as claimed in claim 2, wherein the metal nitride film contains a metal halogen compound.

4. The method as claimed in claim 1, wherein the light is xenon (Xe) light.

5. The method as claimed in claim 1, wherein rare gas atmosphere is employed in the first heating process.

6. The method as claimed in claim 1, reducing gas atmosphere is employed in the first heating process.

7. The method as claimed in claim 6, wherein the reducing gas atmosphere is atmosphere containing $NH_3$, $H_2$, and $B_2H_4$.

8. A method of manufacturing a semiconductor device, comprising:
    forming an insulating film on a silicide layer formed at the surface of a silicon semiconductor substrate;
    etching the insulating film to form a contact hole in which the silicide layer is exposed;
    forming a metal nitride film on the bottom and sidewall of the contact hole;
    carrying out a first heating process at 600° C. or lower on the substrate;
    carrying out, during the first heating process, a second heating process for 10 msec or shorter with light whose reflection coefficient for metal including the metal nitride film is 0.5 or lower;
    forming a contact conductor in the contact hole after the second heating process; and
    forming, on the insulating film, wiring that is electrically connected to the substrate through the contact conductor;
    wherein during the second heating process the silicide layer is converted from a mono-silicide to a di-silicide layer.

9. A method of manufacturing a semiconductor device, comprising:

forming a metal film on source/drain regions formed at the surface of a silicon semiconductor substrate and on a polysilicon gate electrode formed on a gate insulating film that is formed on the substrate between the source/drain regions;

carrying out a first heating process on the substrate, to change the metal film into a metal monosilicide film;

removing unreacted parts of the metal film;

carrying out a second heating process at 600° C. or lower on the substrate; and carrying out, during the second heating process, a third heating process for 20 msec or shorter with light whose wavelength is shorter than a light absorption edge of silicon, to change the metal monosilicide film into a metal disilicide film;

wherein during the second heating process the silicide layer is converted from a mono-silicide to a di-silicide layer.

10. The method as claimed in claim 9, the metal film is selected from the group consisting of cobalt (Co), titanium (Ti), nickel (Ni), hafnium (Hf), zirconium (Zr), palladium (Pd), or platinum (Pt).

11. The method as claimed in claim 5, wherein the silicon nitride film is formed by CVD (chemical vapor deposition) using a reaction between ammonia and one of dichlorosilane and hexachlorosilane.

* * * * *